(12) United States Patent
Matsumoto et al.

(10) Patent No.: US 10,170,635 B2
(45) Date of Patent: Jan. 1, 2019

(54) SEMICONDUCTOR DEVICE, DISPLAY DEVICE, DISPLAY APPARATUS, AND SYSTEM

(71) Applicants: Shinji Matsumoto, Kanagawa (JP); Naoyuki Ueda, Kanagawa (JP); Yuki Nakamura, Tokyo (JP); Yukiko Abe, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(72) Inventors: Shinji Matsumoto, Kanagawa (JP); Naoyuki Ueda, Kanagawa (JP); Yuki Nakamura, Tokyo (JP); Yukiko Abe, Kanagawa (JP); Yuji Sone, Kanagawa (JP); Ryoichi Saotome, Kanagawa (JP); Sadanori Arae, Kanagawa (JP); Minehide Kusayanagi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 91 days.

(21) Appl. No.: 15/370,253

(22) Filed: Dec. 6, 2016

(65) Prior Publication Data
US 2017/0170333 A1    Jun. 15, 2017

(30) Foreign Application Priority Data

Dec. 9, 2015 (JP) .................................. 2015-240522
Dec. 1, 2016 (JP) .................................. 2016-234249

(51) Int. Cl.
*H01L 29/00* (2006.01)
*H01L 29/786* (2006.01)
(Continued)

(52) U.S. Cl.
CPC .... *H01L 29/78696* (2013.01); *H01L 27/1225* (2013.01); *H01L 29/66969* (2013.01);
(Continued)

(58) Field of Classification Search
CPC ............. G09G 5/10; G09G 2300/0426; G09G 2300/08; H01L 27/1225; H01L 29/78696;
(Continued)

(56) References Cited

U.S. PATENT DOCUMENTS

| | | | |
|---|---|---|---|
| 7,872,259 B2 | 1/2011 | Den et al. | |
| 8,530,891 B2 | 9/2013 | Inoue et al. | |
| 9,112,039 B2 | 8/2015 | Ueda et al. | |
| 9,418,842 B2 | 8/2016 | Nakamura et al. | |

(Continued)

FOREIGN PATENT DOCUMENTS

| | | |
|---|---|---|
| JP | 5118811 | 1/2013 |
| JP | 2013-153093 | 8/2013 |

(Continued)

*Primary Examiner* — Muhammad N Edun
(74) *Attorney, Agent, or Firm* — Cooper & Dunham LLP

(57) ABSTRACT

A semiconductor device includes a base; a gate electrode to which a gate voltage is applied; a source electrode and a drain electrode through which an electric current is generated according to the gate voltage being applied to the gate electrode; a semiconductor layer made of an oxide semiconductor; and a gate insulating layer inserted between the gate electrode and the semiconductor layer. The semiconductor layer includes a channel-forming region and a non-channel-forming region; the channel-forming region is in contact with the source electrode and the drain electrode, and the non-channel-forming region is in contact with the source electrode and the drain electrode.

20 Claims, 14 Drawing Sheets

(51) Int. Cl.
*H01L 29/66* (2006.01)
*H01L 27/12* (2006.01)
*H01L 27/32* (2006.01)
*G09G 3/3233* (2016.01)
*G09G 3/34* (2006.01)
*G09G 3/36* (2006.01)
*G09G 3/38* (2006.01)

(52) U.S. Cl.
CPC ....... *H01L 29/7869* (2013.01); *G09G 3/3233* (2013.01); *G09G 3/344* (2013.01); *G09G 3/3648* (2013.01); *G09G 3/38* (2013.01); *H01L 27/3262* (2013.01); *H01L 2251/533* (2013.01)

(58) Field of Classification Search
CPC ........... H01L 29/66969; H01L 29/7869; H01L 2251/533; H01L 27/3262
See application file for complete search history.

(56) References Cited

U.S. PATENT DOCUMENTS

| | | | |
|---|---|---|---|
| 9,816,173 B2* | 11/2017 | Yamazaki | C23C 14/08 |
| 9,875,713 B2* | 1/2018 | Umezaki | G09G 3/3677 |
| 2012/0231588 A1* | 9/2012 | Chiang | H01L 29/7869 |
| | | | 438/158 |
| 2014/0353648 A1 | 12/2014 | Abe et al. | |
| 2015/0028334 A1 | 1/2015 | Matsumoto et al. | |
| 2015/0340504 A1* | 11/2015 | Choi | H01L 29/41733 |
| | | | 257/43 |
| 2015/0349138 A1 | 12/2015 | Sone et al. | |
| 2016/0013215 A1 | 1/2016 | Ueda et al. | |
| 2016/0042947 A1 | 2/2016 | Nakamura et al. | |
| 2016/0190329 A1 | 6/2016 | Matsumoto et al. | |
| 2016/0267873 A1 | 9/2016 | Saotome et al. | |

FOREIGN PATENT DOCUMENTS

| | | |
|---|---|---|
| JP | 5466940 | 4/2014 |
| JP | 2015-046568 | 3/2015 |

* cited by examiner

FIG.8
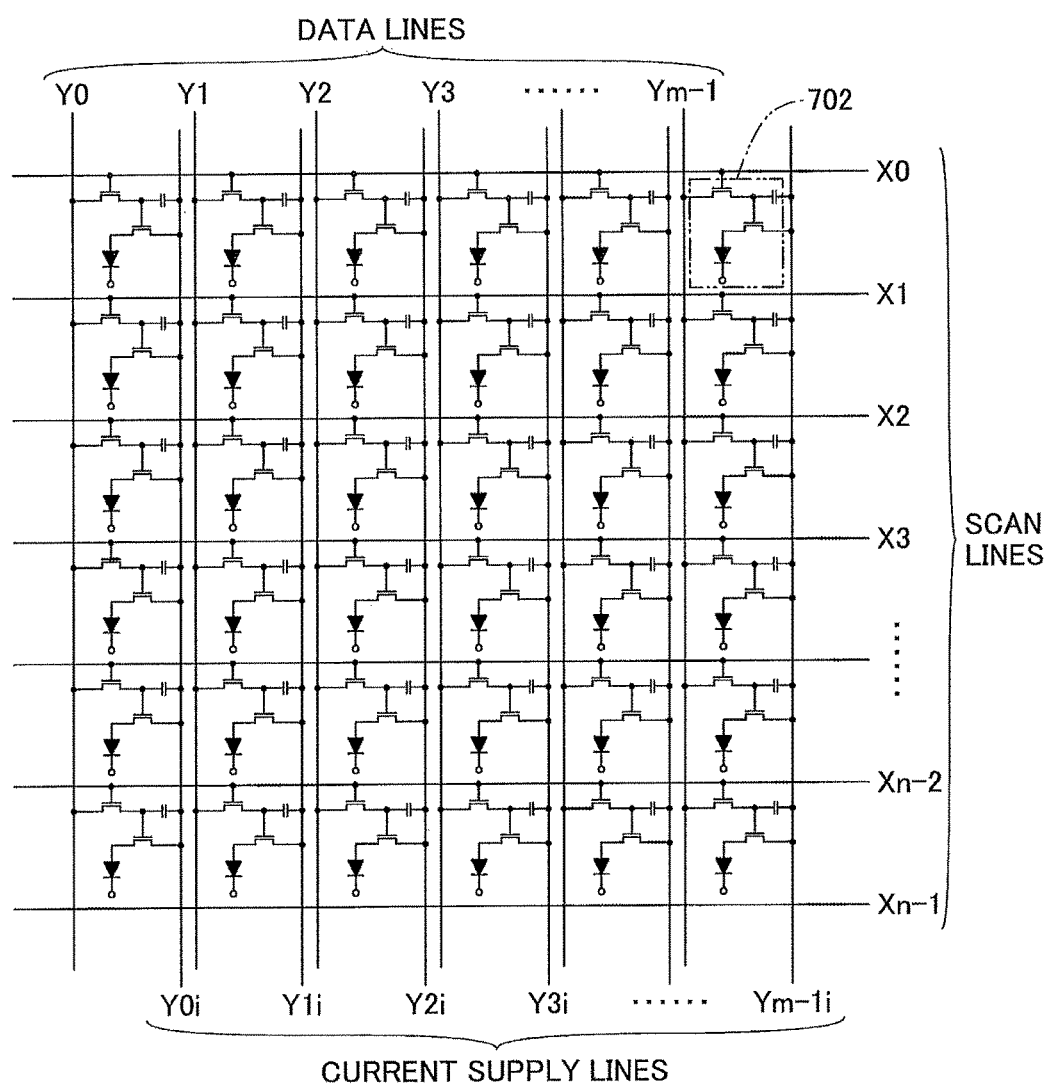
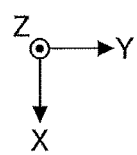

SEMICONDUCTOR DEVICE, DISPLAY DEVICE, DISPLAY APPARATUS, AND SYSTEM

CROSS-REFERENCE TO APPLICATIONS

The present application claims priority under 35 U.S.C. § 119 to Japanese Patent Application No. 2015-240522, filed Dec. 9, 2015 and Japanese Patent Application No. 2016-234249, filed Dec. 1, 2016. The contents of Japanese Patent Application No. 2015-240522 and Japanese Patent Application No. 2016-234249 are incorporated herein by reference in their entirety.

BACKGROUND

1. Technical Field

The present invention relates to a semiconductor device, a display device, a display apparatus, and a system.

2. Description of the Related Art

A LCD (Liquid Crystal Display), an OELD (Organic ElectroLuminescence Display), or a FPD (Flat Panel Display) such as electronic paper is driven by a drive circuit that includes TFTs (Thin Film Transistors) where amorphous silicon or polycrystalline silicon is used as semiconductor layers.

In development of FPDs, technology to manufacture and apply TFTs including field-effect transistors that use oxide semiconductor films with high carrier mobility and small interelement variations at channel-forming regions of semiconductor layers to electronic devices, optical devices, and so forth, has been attracting attention. For example, a field-effect transistor where zinc oxide (ZnO), $In_2O_3$, In—Ga—Zn—O, or the like is used as an oxide semiconductor film has been proposed.

As a field-effect transistor, for example, a field-effect transistor of top-gate and top-contact type which has such a structure that it is easy to reduce the contact resistance of the semiconductor layer with respect to the source and drain electrodes made of metal films (for example, see Japanese Patent No. 5118811) is used. In the field-effect transistor, the semiconductor layer is inserted between the base, and the gate insulating layer and the gate electrode advantageously from the viewpoint of moisture and oxygen in the outside being able to be blocked.

SUMMARY

According to one aspect, a semiconductor device includes a base; a gate electrode to which a gate voltage is applied; a source electrode and a drain electrode through which an electric current is generated according to the gate voltage being applied to the gate electrode; a semiconductor layer made of an oxide semiconductor; and a gate insulating layer inserted between the gate electrode and the semiconductor layer. The semiconductor layer includes a channel-forming region and a non-channel-forming region, the channel-forming region is in contact with the source electrode and the drain electrode, and the non-channel-forming region is in contact with the source electrode and the drain electrode.

Other objects, features, and advantages will become more apparent from the following detailed description when read in conjunction with the accompanying drawings.

BRIEF DESCRIPTION OF THE DRAWINGS

FIGS. 6-8 illustrate the television apparatus according to the second embodiment;

DETAILED DESCRIPTION OF EMBODIMENTS

Figure 1:
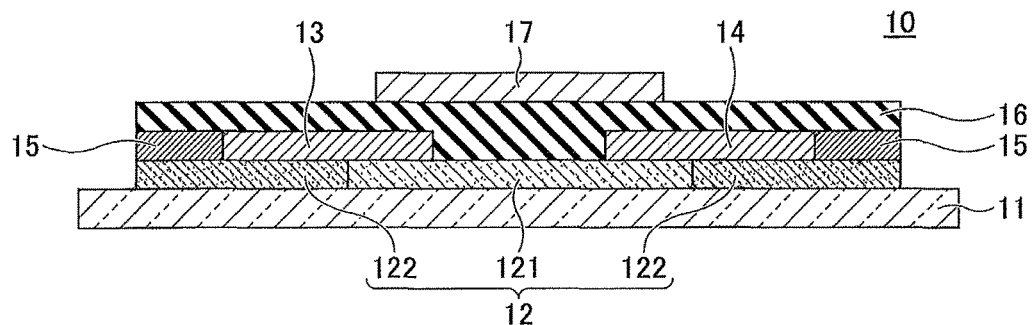
FIG. 1 is a sectional view illustrating a field-effect transistor according to a first embodiment.

In a semiconductor device such as a field-effect transistor of top-gate and top-contact type described above, the metal films that include the source electrode and the drain electrode are formed directly on the base. Therefore, it is advantageous that adhesiveness of the base to the metal films is high from a viewpoint that a TFT manufacturing process is stabilized and the TFT function is stabilized.

Therefore, in many cases, in order to improve the adhesiveness of the base to the metal films, a laminate structure of dissimilar metals is used such that, for example, a metal or the like having high adhesiveness is used as an adhesive layer, for example. However, manufacturing the source electrode and the drain electrode using a laminate structure of dissimilar metals may cause an increase in the number of manufacturing processes, an increase in the process difficulty, an increase in the manufacturing costs, and so forth.

Such a situation may occur also in a semiconductor device such as a field-effect transistor of bottom-gate and top-contact type where, on the gate insulating layer, metal films that include the source electrode and the drain electrode are directly formed.

An object of embodiments is to provide a semiconductor device that can be easily manufactured and has superior adhesiveness of the source electrode and the drain electrode to the lower layer.

Below, embodiments of the present invention will be described with reference to the drawings. Concerning the respective drawings, the same reference numerals are given to the same elements, and duplicate description may be omitted.

<First Embodiment>
[Structure of Field-Effect Transistor]

FIG. 1 is a sectional view illustrating a field-effect transistor according to a first embodiment. With reference to FIG. 1, a field-effect transistor 10 is a field-effect transistor of top-gate and top-contact type including a base 11, a semiconductor layer 12, a source electrode 13, a drain electrode 14, interconnection members 15, a gate insulating layer 16, and a gate electrode 17. Note that, the field-effect transistor 10 is one example of a semiconductor device according to the present invention.

In the field-effect transistor 10, on the base 11 having an insulating property, the semiconductor layer 12 is formed, and, on the semiconductor layer 12, the source electrode 13, the drain electrode 14, and the interconnection member 15 are formed. Further, the gate insulating layer 16 is formed to coat the semiconductor layer 12, the source electrode 13, the drain electrode 14, and the interconnection members 15. On the gate insulating layer 16, the gate electrode 17 is formed. Below, the respective elements of the field-effect transistor 10 will be described in detail.

Note that, in the following description of the first embodiment, for the sake of convenience, the gate electrode 17 side may be referred to as an upper side or one side, whereas, the base 11 side may be referred to as a lower side or another side. Also, a face of each element on the gate electrode 17 side may be referred to as a top face or one face, whereas, a face of each element on the base 11 side may be referred to as a bottom face or another face. However, the field-effect transistor 10 can be used in an upside-down state. Also, the field-effect transistor 10 can be placed at any angle. Also, a "plan view" denotes a view of an object taken when the object is viewed in the normal direction from the upper side, and a "plan shape" of an object denotes a shape of the object taken when the object is viewed in the normal direction from the upper side.

The base 11 is a member having an insulting property used for forming the semiconductor layer 12 and so forth. The shape, the structure, and the size of the base 11 are not specially limited, and can be appropriately determined depending on the purpose. The material of the base 11 is not specially limited, and can be appropriately selected depending on the purpose. For example, a glass base, a plastic base, or the like, can be used. The glass base is not specially limited, and can be appropriately selected depending on the purpose. For example, alkali-free glass, silica glass, or the like, can be used. The plastic base is not specially limited, and can be appropriately selected depending on the purpose. For example, polycarbonate (PC), polyimide (PI), polyethylene terephthalate (PET), polyethylene naphthalene (PEN), or the like, can be used.

The semiconductor layer 12 is made of an oxide semiconductor, and is formed on the base 11 at a predetermined area. As the oxide semiconductor of the semiconductor layer 12, for example, an n-type oxide semiconductor can be used. The n-type oxide semiconductor is not specially limited, and can be appropriately selected depending on the purpose. For example, $ZnO$, $SnO_2$, $In_2O_3$, $TiO_2$, $Ga_2O_3$, or the like, can be used.

As the n-type oxide semiconductor, it is also possible to use an oxide containing a plurality of metals such as an In—Zn-based oxide, an In—Sn-based oxide, an In—Ga-based oxide, a Sn—Zn-based oxide, a Sn—Ga-based oxide, a Zn—Ga-based oxide, an In—Zn—Sn-based oxide, an In—Ga—Zn-based oxide, an In—Sn—Ga-based oxide, a Sn—Ga—Zn-based oxide, an In—Al—Zn-based oxide, an Al—Ga—Zn-based oxide, a Sn—Al—Zn-based oxide, an In—Hf—Zn-based oxide, or an In—Al—Ga—Zn-based oxide.

The n-type oxide semiconductor is desired to contain at least any one of indium, zinc, tin, gallium, and titanium, and contain an alkali-earth metal, from such a view point that high field-effect mobility can be acquired and electron carrier concentration can be appropriately controlled. The n-type oxide semiconductor is more desired to contain indium and an alkali-earth metal. As the alkali-earth metal, beryllium, magnesium, calcium, strontium, barium, radium, or the like, can be used.

In an indium oxide, the electron carrier concentration changes approximately in a range between $10^{18}$ $cm^{-3}$ and $10^{20}$ $cm^{-3}$, according to the oxygen deficiency amount. However, an indium oxide has a nature that the oxygen deficiency is likely to occur, and, unexpected oxygen deficiency may occur during a process after a semiconductor film is formed. Therefore, it is desirable to form an oxide using mainly two metals, i.e., indium and an alkali-earth metal that is more likely to be coupled with oxygen than indium, from such a viewpoint that it is possible to avoid unexpected oxygen deficiency and it is easy to appropriately control the composition so that it is possible to easily and appropriately control the electron carrier concentration.

It is possible to control the electron carrier concentration of the semiconductor layer 12 within a suitable range, due to the elements of the semiconductor layer 12, the manufacturing process conditions, processes carried out after the formation of the film, and so forth. The average thickness of the semiconductor layer 12 is not specially limited, and can be appropriately determined depending on the purpose. For example, the average thickness of the semiconductor layer 12 is desired to fall within a range between 1 nm and 200 nm, and is more desired to fall within a range between 2 nm and 100 nm.

The semiconductor layer 12 includes a channel-forming region 121 (active region) and a non-channel-forming region 122 (inactive region). Each of the channel-forming region 121 and the non-channel-forming region 122 is formed to be in contact with the source electrode 13, the drain electrode 14, and the interconnection member 15. All or a part of the channel-forming region 121 can act as a channel region. The non-channel-forming region 122 can be placed to surround the channel-forming region 121 in a plan view, for example. The layer thickness of the channel-forming region 121 can be made approximately the same as the layer thickness of the non-channel-forming region 122.

The source electrode 13 and the drain electrode 14 are formed to be in contact with the top face of the semiconductor layer 12. The source electrode 13 and the drain electrode 14 partially overlap with the channel-forming region 121 of the semiconductor layer 12, and are formed to be apart by a predetermined space corresponding to the channel region. The source electrode 13 and the drain electrode 14 generate an electric current according to the gate voltage being applied.

The material of the source electrode 13 and the drain electrode 14 is not specially limited, and can be appropriately selected depending on the purpose. For example, a metal such as Mo, Al, Au, Ag, or Cu, or an alloy of any of these metals can be used. The average thickness of the source electrode 13 and the drain electrode 14 is not specially limited, and can be appropriately determined depending on the purpose. The average thickness of the source electrode 13 and the drain electrode 14 is desired to fall within a range between 40 nm and 2 μm, and is more desired to fall within a range between 70 nm and 1 μm.

The interconnection members 15 are formed in the same layer as the source electrode 13 and the drain electrode 14, and are in contact with the source electrode 13 and the drain electrode 14, respectively. The interconnection members 15 are formed to be in contact with the top face of the non-channel-forming region 122.

The interconnection members 15 include metal films appropriately formed. The interconnection members 15 include metal films used as terminals to measure electrical characteristics of the semiconductor device, metal films electrically connecting semiconductor devices included in a drive circuit that will be described later, metal films connecting the drive circuit and light control devices, metal films electrically connecting the derive circuit and an image generation apparatus, and so forth.

The material of the interconnection members 15 is not specially limited, and can be appropriately selected depending on the purpose. For example, a metal such as Mo, Al, Au, Ag, or Cu, or an alloy of any of these metals can be used. The average thickness of the interconnection members 15 can be approximately the same as the average thickness of the source electrode 13 and the drain electrode 14.

The gate insulating layer 16 is formed between the semiconductor layer 12 and the gate electrode 17 and coats the source electrode 13, the drain electrode 14, and the interconnection members 15. The gate insulating layer 16 functions to insulate the source electrode 13 and the drain electrode 14 from the gate electrode 17. The material of the gate insulating layer 16 is not specially limited, and can be appropriately selected depending on the purpose. For example, an inorganic insulating material, an organic insulating material, or the like, can be used.

As the inorganic insulating material, for example, a silicon oxide, an aluminum oxide, a tantalum oxide, a titanium oxide, an yttrium oxide, a lanthanum oxide, a hafnium oxide, a zirconium oxide, a silicon nitride, an aluminum nitride, a mixture of any of these oxides, or the like, can be used. Also, as the organic insulating material, for example, polyimide, polyamide, polyacrylate, polyvinyl alcohol, novolac resin, or the like, can be used. The average thickness of the gate insulating layer 16 is not specially limited, and can be appropriately determined depending on the purpose. For example, the average thickness of the gate insulating layer 16 is desired to fall within a range between 50 nm and 1000 nm, and is more desired to fall within a range between 100 nm and 500 nm.

The gate electrode 17 is formed on the gate insulating layer 16 at a predetermined area. The gate electrode 17 is used to apply the gate voltage. The material of the gate electrode 17 is not specially limited, and can be appropriately selected depending on the purpose. For example, as the material of the gate electrode 17, a metal such as platinum, palladium, gold, silver, copper, zinc, aluminum, nickel, chromium, tantalum, molybdenum, titanium or the like, an alloy of any of these metals, a mixture of any of these materials, or the like, can be used.

Also, as the material of the gate electrode 17, an electrically conductive oxide such as an indium oxide, a zinc oxide, a tin oxide, a gallium oxide, a niobium oxide, $In_2O_3$ to which tin (Sn) is added (ITO), ZnO to which gallium (Ga) is added, ZnO to which aluminum (Al) is added, $SnO_2$ to which antimony (Sb) is added, a complex compound of any of these oxides, a mixture of any of these oxides, or the like, can be used. The average thickness of the gate electrode 17 is not specially limited, and can be appropriately determined depending on the purpose. The average thickness of the gate electrode 17 is desired to fall within a range between 10 nm and 200 nm, and is more desired to fall within a range between 50 nm and 100 nm.

Thus, in the field-effect transistor 10, the channel-forming region 121 and the non-channel-forming region 122 are included in the semiconductor layer 12. The channel-forming region 121 and the non-channel-forming region 122 are in contact with the source electrode 13, the drain electrode 14, and the interconnection member 15.

That is, the source electrode 13, the drain electrode 14, and the interconnection members 15 are not directly in contact with the base 11, and are in contact with the channel-forming region 121 and the non-channel-forming region 122 (adhesive layer) both made of the oxide semiconductor superior in adhesiveness to glass, silicon, a silicon oxide film, and so forth.

Because of such a structure, the adhesiveness of the source electrode 13, the drain electrode 14, and the interconnection members 15 to the lower layer is improved, and it is possible to acquire the superior film stability (the robustness against manufacturing processes).

[Manufacturing Process of Field-Effect Transistor]

Next, a method of manufacturing the field-effect transistor illustrated in FIG. 1 will be described. FIGS. 2A-2D illustrate a field-effect transistor manufacturing process according to the first embodiment.

Figure 2A:
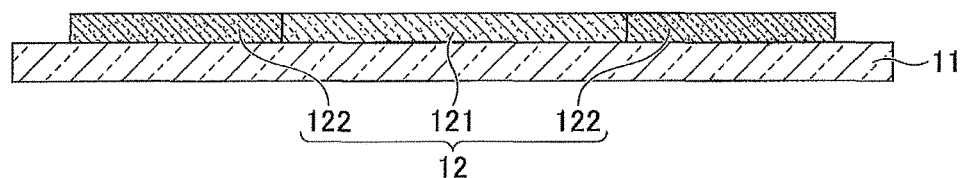
FIGS. 2A-2D illustrate a manufacturing process of the field-effect transistor according to the first embodiment.

First, in a process illustrated in FIG. 2A, the base 11 made of a glass base or the like is prepared, and the semiconductor layer 12 is formed on the base 11. The material and the thickness of the base 11 can be selected appropriately as described above. Also, it is desirable, from the viewpoint of surface cleaning and improvement in the adhesiveness of the base 11, to carry out pretreatment such as oxygen plasma treatment, UV ozone treatment, or UV irradiation cleaning.

A manufacturing method for the semiconductor layer 12 is not specially limited, and any method can be appropriately selected depending on the purpose. For example, (i) a method where, after film formation through vacuum treatment such as sputtering, pulse laser deposition (PLD), chemical vaper deposition (CVD), or atomic layer deposition (ALD), or solution treatment such as dip coating, spin coating, or die coating, patterning is carried out through photolithography, (ii) a method where a desired shape of the film is directly formed through a printing method such as an inkjet method, a nanoimprint method, or a gravure method, or the like, can be used.

Note that, the semiconductor layer 12 is a continuous layer formed though a single process, and, at this time, is not distinguished between a plurality of regions. However, the semiconductor layer 12 includes regions that finally become, when the field-effect transistor 10 is completed, the channel-forming region 121 and the non-channel-forming region 122. Therefore, for the sake of convenience, the semiconductor layer 12 is illustrated as being distinguished between the channel-forming region 121 and the non-channel-forming region 122.

Figure 2B:
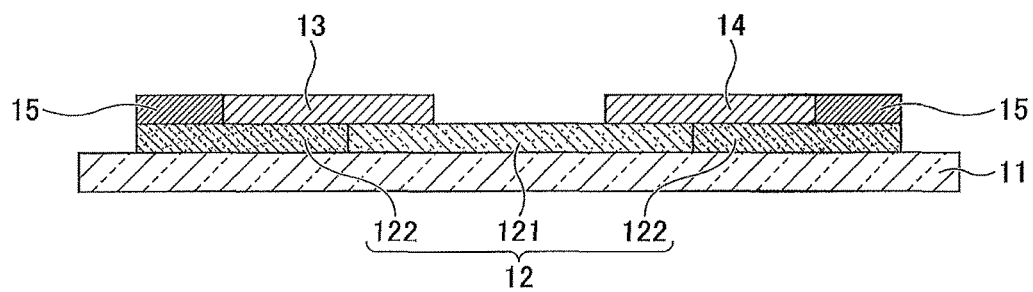

Next, in a process illustrated in FIG. 2B, the source electrode 13, the drain electrode 14, and the interconnection members 15 are formed on the semiconductor layer 12. The method to form the source electrode 13, the drain electrode 14, and the interconnection members 15 is not specially limited. The method to form the source electrode 13, the drain electrode 14, and the interconnection members 15 can be appropriately selected depending on the purpose. For example, (i) a method where after film formation through sputtering, vacuum deposition, dip coating, spin coating, or die coating, patterning is carried out through photolithography, (ii) a method where a desired shape of film is directly formed through a printing method such as an inkjet method, a nanoimprint method, or a gravure method, or the like, can be used.

In the process illustrated in FIG. 2B, first, a metal film is formed on the base 11 and the semiconductor layer 12 through vacuum deposition or the like. Then, patterning is carried out on the formed metal film through photolithography and etching. Thereby, it is possible to form the source electrode 13, the drain electrode 14, and the interconnection members 15 with desired shapes. The materials and thicknesses of the source electrode 13, the drain electrode 14, and the interconnection members 15 can be appropriately selected as described above.

Figure 2C:
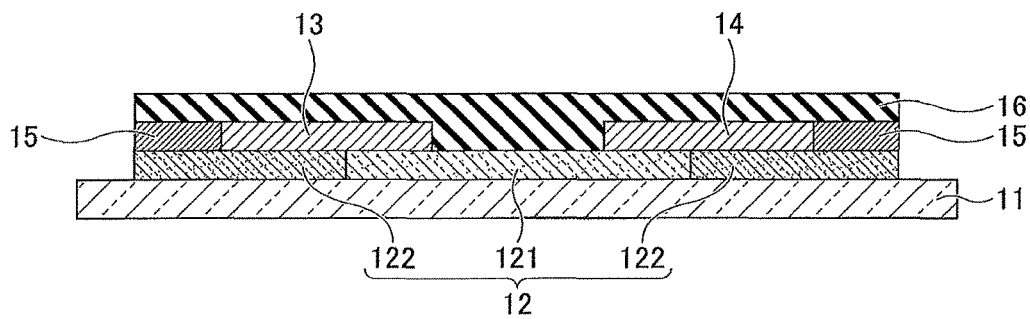

Next, in a process illustrated in FIG. 2C, the gate insulating layer 16 is formed on the semiconductor layer 12 to coat the source electrode 13, the drain electrode 14, and the interconnection members 15. The method to manufacture the gate insulating layer 16 is not specially limited. The method to manufacture the gate insulating layer 16 can be appropriately selected depending on the purpose. For example, (i) a method where, after film formation through vacuum treatment such as sputtering, pulse laser deposition (PLD), chemical vaper deposition (CVD), or atomic layer deposition (ALD), or solution treatment such as dip coating, spin coating, or die coating, patterning is carried out through photolithography, (ii) a method where a desired shape of film is directly formed through a printing method such as an inkjet method, a nanoimprint method, or a gravure method, or the like, can be used. The material and the thickness of the gate insulating layer 16 can be appropriately selected as described above.

Figure 2D:
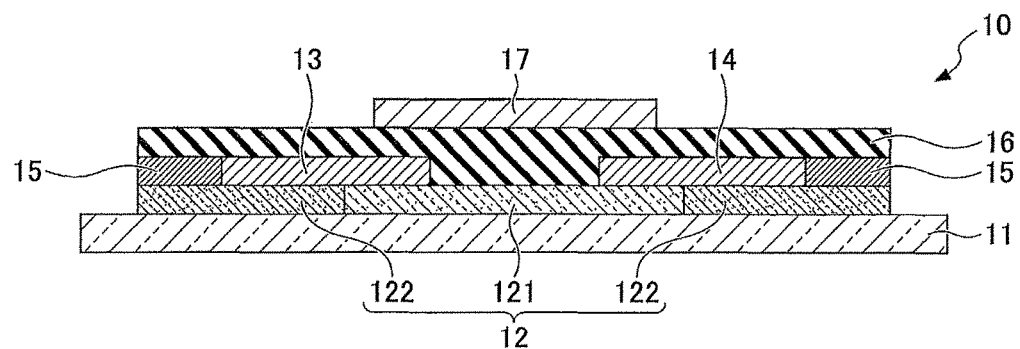

Next, in a process illustrated in FIG. 2D, the gate electrode 17 is formed on the gate insulating layer 16. The method to form the gate electrode 17 is not specially limited. The method to form the gate electrode 17 can be appropriately selected depending on the purpose. For example, (i) a method where after film formation through sputtering, vacuum deposition, dip coating, spin coating, or die coating, patterning is carried out through photolithography, (ii) a method where a desired shape of the film is directly formed through a printing method such as an inkjet method, a nanoimprint method, or a gravure method, or the like, can be used.

In the process illustrated in FIG. 2D, first, a metal film is formed on the gate insulating layer 16 through vacuum deposition or the like. Then, the formed metal film is patterned through photolithography and etching to form the gate electrode 17 with a desired shape. The material and the thickness of the gate electrode 17 can be appropriately selected as described above.

Through the processes described above, it is possible to manufacture the field-effect transistor 10 of top-gate and top-contact type.

Thus, the non-channel-forming region 122 for improving the film strength of the source electrode 13, the drain electrode 14, and the interconnection members 15 (i.e., the layer for improving the adhesiveness to the lower layer) is formed through the same process as the process of the channel-forming region 121 in the process of forming the semiconductor layer 12. Therefore, in order to improve the film strength of the source electrode 13, the drain electrode 14, and the interconnection members 15 (in order to improve the adhesiveness to the lower layer), there is no need to carry out an extra process to form a layer to improve the film strength (a layer for improving the adhesiveness to the lower layer) in addition to the process to form the semiconductor layer 12. As a result, it is possible to achieve the field-effect transistor 10 that has high adhesiveness of the source electrode 13, the drain electrode 14, and the interconnection members 15 to the lower layer, and has the superior film stability (i.e., the robustness against manufacturing processes) with a simple manufacturing process.

In the related art, concerning interconnection members formed on a $SiO_2$ surface or the like, there is a method to improve adhesive force to electrodes and interconnection members by injecting another element into a metal film that becomes the electrodes and the interconnection members. In this regard, according to the manufacturing method of the first embodiment to manufacture the field-effect transistor 10 described above, it is not necessary to add another element to the source electrode 13, the drain electrode 14, and the interconnection members 15, and therefore, it is possible to use a pure metal. Therefore, in comparison to the above-mentioned method of the related art, it is possible to acquire the electrodes and the interconnection members having low electric resistance.

<Variant of First Embodiment>

A variant of the first embodiment is one example of a field-effect transistor of bottom-gate and top-contact type. Note that, concerning the variant of the first embodiment, description may be omitted for the same elements as the elements of the already described first embodiment.

Figure 3:
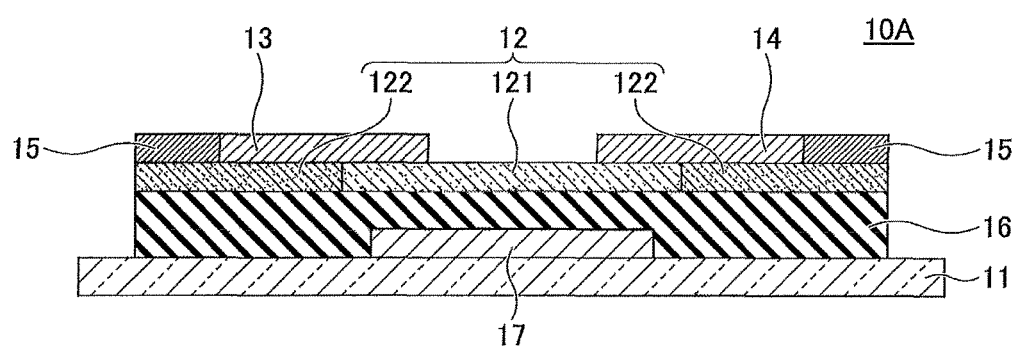
FIG. 3 is a sectional view illustrating a field-effect transistor according to a variant of the first embodiment.

FIG. 3 is a sectional view illustrating a field-effect transistor according to the variant of the first embodiment. With reference to FIG. 3, the field-effect transistor 10A is a field-effect transistor of bottom-gate and top-contact type. Note that the field-effect transistor 10A is another example of a semiconductor device according to the present invention.

The field-effect transistor 10A is different from the field-effect transistor 10 (see FIG. 1) in the layer structure. Actually, according to the field-effect transistor 10A, a gate electrode 17 is formed on a base 11 having an insulating property, and a gate insulating layer 16 is formed on the base 11 and coats the gate electrode 17. A semiconductor layer 12 is formed on the gate insulating layer 16, and a source electrode 13, a drain electrode 14, and interconnection members 15 are formed on the semiconductor layer 12.

That is, according to the field-effect transistor 10A, the source electrode 13, the drain electrode 14, and the interconnection members 15 are not directly in contact with the gate insulating layer 16, and are in contact with a channel-forming region 121 and a non-channel-forming region 122 (adhesive layer) made of an oxide semiconductor superior in adhesiveness with glass, silicon, a silicon oxide film, and so forth.

Due to such a structure, in the same manner as the field-effect transistor 10, adhesiveness of the source electrode 13, the drain electrode 14, and the interconnection members 15 to the lower layer is improved, and the superior film stability (the robustness against manufacturing processes) can be acquired.

Thus, a layer structure of a field-effect transistor according to the present invention is not specially limited, and the structure illustrated in FIG. 1 or 3 can be appropriately selected depending on the purpose.

Note that, the field-effect transistor of bottom-gate and top-contact type can be manufactured as a result of the order of the respective processes illustrated in FIGS. 2A-2D being appropriately changed.

<First Example>

According to a first example, a field-effect transistor of top-gate and top-contact type illustrated in FIG. 1 was produced.

(Formation of Semiconductor Layer 12)

First, a semiconductor layer 12 having a predetermined shape was formed on a base 11. Actually, first, as the base 11, alkali-free glass was used, and a Mg—In-based oxide semiconductor film is formed on the base 11 through a sputtering method. As a target, a polycrystalline fired body having a composition of $In_2MgO_4$ (with a size of a 4-inch diameter) was used. The ultimate vacuum pressure in a sputtering chamber was $2\times10^{-5}$ Pa. The flow rates of an argon gas and an oxygen gas to be flown during the sputtering were adjusted to have the total pressure of 0.3 Pa.

During the sputtering, a holder that holds the base 11 was cooled by water to control the temperature of the base 11 within a range between 15° C. and 35° C. With the sputtering power 150 W and the sputtering time 30 minutes, the Mg—In-based oxide semiconductor film having the thickness 50 nm was formed. Thereafter, photolithography and etching were carried out on the Mg—In-based oxide semiconductor film to form the semiconductor layer 12 having a predetermined shape.

(Formation of Source Electrode 13, Drain Electrode 14, and Interconnection Members 15)

Next, using a vacuum deposition method, an Au film was formed on the base 11 and the semiconductor layer 12.

Thereafter, photolithography and etching were carried out on the Au film to form a source electrode 13 and a drain electrode 14, and interconnection members 15 connecting between the source electrode 13 and the drain electrode 14 on the semiconductor layer 12.

(Formation of Gate Insulating Layer 16)

Next, through a plasma CVD method, a $SiO_2$ film was formed to have the thickness of 200 nm, to form a gate insulating layer 16.

(Formation of Gate Electrode 17)

Next, on the gate insulating layer 16, using a vacuum deposition method, an Al film was formed. Then, photolithography and etching were carried out on the Al film to form a gate electrode 17 having a predetermined shape. Thus, a field-effect transistor of top-gate and top-contact type illustrated in FIG. 1 was produced.

(Transistor Performance Evaluation)

Performance evaluation was carried out on the acquired field-effect transistor, using a semiconductor parameter analyzer apparatus ("semiconductor parameter analyzer B1500" made by Agilent Technologies Japan, Ltd.). Actually, the source-drain voltage Vds 20 V was applied and the gate voltage Vg was changed from −30 V through +30 V to evaluate the current-voltage characteristics. The field-effect mobility was calculated for the saturation region. Also, the ratio of the source-drain current Ids (On/Off ratio) between the transistor's turned-on state (for example, Vg=20 V) and the turned-off state (for example, Vg=−20 V) was calculated.

<First Comparison Example>

Figure 4:
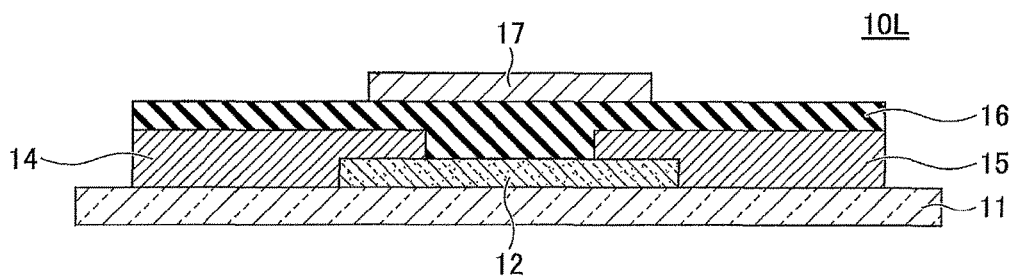
FIG. 4 is a sectional view illustrating a field-effect transistor in a first comparison example.

A field-effect transistor of top-gate and top-contact type 10L illustrated in FIG. 4 was produced in the same way as the first example except that Formation of Semiconductor Layer 12 was changed as will be described now. Also, evaluation was carried out in the same way as the first example.

(Formation of Semiconductor Layer 12)

A Mg—In-based oxide semiconductor film was formed on a base 11 through a sputtering method in the same way as the first example. Thereafter, photolithography and etching were carried out on the Mg—In-based oxide semiconductor film to form a semiconductor layer 12 at an area to be an channel-forming region (active region). That is, a field-effect transistor of top-gate and top-contact type 10L where, as illustrated in FIG. 4, nothing corresponding to the non-channel-forming region 122 of FIG. 1 was formed on the base 11 was produced.

<Summary of First Example and First Comparison Example>

Results of the first example and the first comparison example are shown in Table 1 below.

TABLE 1

| | MATERIAL OF SOURCE ELECTRODE, DRAIN ELECTRODE, AND INTERCONNECTION MEMBERS | MATERIAL OF NON-CHANNEL-FORMING REGION | ELECTRODE PEELING | FIELD-EFFECT MOBILITY ($cm^2/Vs$) | ON/OFF RATIO |
|---|---|---|---|---|---|
| FIRST EXAMPLE | Au | Mg—In-BASED OXIDE | NOT PRESENT | 7.3 | $10^7$ |
| FIRST COMPARISON EXAMPLE | Au | NOT FORMED | MANY | — | — |

According to Table 1, in the first example, the oxide semiconductor (a part of the semiconductor layer 12) was used as the adhesive layer for the base with the source electrode, the drain electrode, and the interconnection members. Thereby, it was possible to form the field-effect transistors without peeling of the electrodes. Also, it was possible to acquire the superior transistor characteristics (the field-effect mobility and the On/Off ratio).

On the other hand, in the first comparison example, there was no adhesive layer for the base with the source electrode, the drain electrode, and the interconnection members. Therefore, film peeling of the electrodes made of Au occurred many times, and it was not possible to manufacture field-effect transistors at a good yield. Therefore, it was not possible to calculate the field-effect mobility and the On/Off ratio.

<Second Example>

In a second example, a field-effect transistor of bottom-gate and top-contact type illustrated in FIG. 3 was produced.

(Formation of Gate Electrode 17)

First, on a base 11, a gate electrode 17 having a predetermined shape was formed. Actually, first, as the base 11, alkali-free glass was used, and, on the base 11, a laminate film of a Cr film and an Au film was formed using a vacuum deposition method. Thereafter, on the laminate film of the Cr film and the Au film, photolithography and etching were carried out to form the gate electrode 17 having a predetermined shape.

(Formation of Gate Insulating Layer 16, Semiconductor Layer 12, Source Electrode 13, and so Forth)

Next, in the same way as the first example, a gate insulating layer 16 coating the gate electrode 17 was formed on the base 11. Thereafter, in the same way as the first example, a semiconductor layer 12 was formed on the gate insulating layer 16. Further, in the same way as the first example, a source electrode 13, a drain electrode 14, and interconnection members 15 were formed on the semiconductor layer 12. Thus, a field-effect transistor of bottom-gate and top-contact type illustrated in FIG. 3 was produced.

(Transistor Performance Evaluation)

Next, in the same way as the first example, the field-effect mobility and the On/Off ratio were calculated.

<Second Comparison Example>

A field-effect transistor of bottom-gate and top-contact type was produced in the same way as the second example except that formation of semiconductor layer 12 was changed to the method which will be described now. Also, evaluation was carried out in the same way as the second example.

(Formation of Semiconductor Layer 12)

On a gate insulating layer 16, a Mg—In-based oxide semiconductor film was formed through a sputtering method in the same way as the second example, Thereafter, on the Mg—In-based oxide semiconductor film, photolithography and etching were carried out to form a semiconductor layer 12 at the area corresponding to the channel-forming region (active region). That is, a field-effect transistor of bottom-gate and top-contact type was produced where, on the gate insulating layer 16, no layer part corresponding to the non-channel-forming region 122 of FIG. 3 was formed.

<Summary of Second Example and Second Comparison Example>

Results of the second example and the second comparison example are illustrated in Table 2.

As illustrated in Table 2, in the second example, the oxide semiconductor (a part of the semiconductor layer 12) was used as the adhesive layer for the gate insulating layer with the source electrode, the drain electrode, and the interconnection members. Thus, it was possible to form the field-effect transistor without peeling of the electrodes. Also, it was possible to acquire the superior transistor characteristics (the field-effect mobility and the On/Off ratio).

On the other hand, in the second comparison example, there was no adhesive layer for the gate insulating layer with the source electrode, the drain electrode, and the interconnection members. Therefore, film peeling of electrodes made of Au occurred many times, and it was not possible to manufacture field-effect transistors at a good yield. Therefore, it was not possible to calculate the field-effect mobility and the On/Off ratio.

<Third Example>

A field-effect transistor of bottom-gate and top-contact type was produced in the same way as the second example except that, as the material of the source electrode 13, the drain electrode 14, and the interconnection members 15, Cu was used instead of Au. Also, evaluation was carried out in the same way as the second example.

<Third Comparison Example>

Except that the material of the source electrode 13, the drain electrode 14, and the interconnection members 15 was changed to Cu from Au, a field-effect transistor of bottom-gate and top-contact type was produced in the same way as the second comparison example. Also, evaluation was carried out in the same way as the second example.

<Summary of Third Example and Third Comparison Example>

Table 3 illustrates results of the third example and the third comparison example.

TABLE 2

|  | MATERIAL OF SOURCE ELECTRODE, DRAIN ELECTRODE, AND INTER-CONNECTION MEMBERS | MATERIAL OF NON-CHANNEL-FORMING REGION | ELECTRODE PEELING | FIELD-EFFECT MOBILITY ($cm^2/Vs$) | ON/OFF RATIO |
|---|---|---|---|---|---|
| SECOND EXAMPLE | Au | Mg—In-BASED OXIDE | NOT PRESENT | 7.5 | $10^7$ |
| SECOND COMPARISON EXAMPLE | Au | NOT FORMED | MANY | — | — |

TABLE 3

| | MATERIAL OF SOURCE ELECTRODE, DRAIN ELECTRODE, AND INTERCONNECTION MEMBERS | MATERIAL OF NON-CHANNEL-FORMING REGION | ELECTRODE PEELING | FIELD-EFFECT MOBILITY ($cm^2/Vs$) | ON/OFF RATIO |
|---|---|---|---|---|---|
| THIRD EXAMPLE | Cu | Mg—In-BASED OXIDE | NOT PRESENT | 8.1 | $10^7$ |
| THIRD COMPARISON EXAMPLE | Cu | NOT FORMED | MANY | 0.1 | $10^5$ |

According to Table 3, in the third example, by using the oxide semiconductor (a part of the semiconductor layer 12) as an adhesive layer for the gate insulating layer with the source electrode, the drain electrode, and the interconnection members, it was possible to form the field-effect transistor without peeling of the electrodes. Also, it was possible to acquire the superior transistor characteristics (the field-effect mobility and the On/Off ratio).

On the other hand, in the third comparison example, there was no adhesive layer for the gate insulating layer with the source electrode, the drain electrode, and the interconnection members. Therefore, film peeling of the electrodes made of Cu occurred many times, and it was not possible to manufacture field-effect transistors at a good yield. Also, it was not possible to acquire superior transistor characteristics from the devices for which it was possible to acquire the transistor characteristics. This may be because, due to the source electrode, the drain electrode, and the interconnection members being not stabilized as films, the functions as the electrodes were not sufficient.

<Fourth Through Sixth Examples>

Field-effect transistors of bottom-gate and top-contact type were produced in the same way as the second example except that formation of semiconductor layer 12 was changed as illustrated below. Also, evaluation was carried out in the same way as the second example.

(Formation of Semiconductor Layer 12)

In a beaker, 3.55 g of indium nitrate ($In(NO_3)_3 \cdot 3H_2O$) and 0.139 g of strontium chloride ($SrCl_2 \cdot 6H_2O$) were measured, 20 mL of 1,2-propanediol and 20 mL of ethyleneglycolmonomethylether were added, the ingredients were mixed at room temperature, and were dissolved, and thus, an n-type oxide semiconductor film formation coating liquid No. 1 to be used for manufacturing a fourth example was produced.

In the same way, in a beaker, 3.55 g of indium nitrate ($In(NO_3)_3 \cdot 3H_2O$) and 0.125 g of calcium nitrate ($Ca(NO_3)_2 \cdot 4H_2O$) were measured, 20 mL of 1,2-propanediol and 20 mL of ethyleneglycolmonomethylether were added, and the ingredients were mixed at room temperature, and were dissolved. Thus, an n-type oxide semiconductor film formation coating liquid No. 2 to be used for manufacturing a fifth example was produced.

In the same way, in a beaker, 3.55 g of indium nitrate ($In(NO_3)_3 \cdot 3H_2O$) and 0.125 g of barium chloride ($BaCl_2 \cdot 2H_2O$) were measured, 20 mL of 1,2-ethanediol and 20 mL of ethyleneglycolmonomethylether were added, and the ingredients were mixed at room temperature, and were dissolved. Thus, an n-type oxide semiconductor film formation coating liquid No. 3 to be used for manufacturing a sixth example was produced.

On a gate insulating layer, the oxide semiconductor film formation coating liquids Nos. 1-3 were applied in predetermined patterns using an inkjet apparatus, respectively. The base was dried on a hot plate heated at 120° C. for 10 minutes. Thereafter, the base was fired in the atmosphere at 400° C. for 1 hour, and thus, an In—Sr-based oxide film, an In—Ca-based oxide film, and an In—Ba-based oxide film were formed, respectively.

<Fourth Through Sixth Comparison Examples>

In the same way as the fourth through sixth examples, on a gate insulating layer, the oxide semiconductor film formation coating liquids Nos. 1-3 were applied in predetermined patterns using an inkjet apparatus, respectively. The base was dried on a hot plate heated at 120° C. for 10 minutes. Thereafter, the base was fired in the atmosphere at 400° C. for 1 hour, and thus, an In—Sr-based oxide film, an In—Ca-based oxide film, and an In—Ba-based oxide film, were formed, respectively.

However, the respective oxide films were formed at the areas corresponding to the channel-forming regions (active regions). That is, the field-effect transistors of bottom-gate and top-contact type were produced where there are no layer parts corresponding to the non-channel-forming regions 122.

<Summary of Fourth Through Sixth Examples and Fourth Through Sixth Comparison Examples>

Table 4 illustrates results of the fourth through sixth examples and the fourth through sixth comparison examples.

TABLE 4

| | MATERIAL OF SOURCE ELECTRODE, DRAIN ELECTRODE, AND INTERCONNECTION MEMBERS | MATERIAL OF NON-CHANNEL-FORMING REGION | ELECTRODE PEELING | FIELD-EFFECT MOBILITY ($cm^2$/Vs) | ON/OFF RATIO |
|---|---|---|---|---|---|
| FOURTH EXAMPLE | Au | In—Sr-BASED OXIDE | NOT PRESENT | 7.1 | $10^7$ |
| FIFTH EXAMPLE | Au | In—Ca-BASED OXIDE | NOT PRESENT | 6.9 | $10^7$ |
| SIXTH EXAMPLE | Au | In—Ba-BASED OXIDE | NOT PRESENT | 6.9 | $10^7$ |
| FOURTH COMPARISON EXAMPLE | Au | NOT FORMED | MANY | 0.05 | $10^5$ |
| FIFTH COMPARISON EXAMPLE | Au | NOT FORMED | MANY | 0.06 | $10^5$ |
| SIXTH COMPARISON EXAMPLE | Au | NOT FORMED | MANY | 0.02 | $10^5$ |

According to Table 4, in the fourth through sixth examples, by using the oxide semiconductors (parts of the semiconductor layers 12) as adhesive layers for the gate insulating layers with the source electrodes, the drain electrodes, and the interconnection members, it was possible to form the field-effect transistors without peeling of the electrodes. Also, it was possible to acquire the superior transistor characteristics (the field-effect mobility and the On/Off ratio).

On the other hand, in the fourth through sixth comparison examples, there were no adhesive layers for the gate insulating layers with the source electrodes, the drain electrodes, and the interconnection members. Therefore, film peeling of the electrodes made of Au occurred many times, and it was not possible to manufacture field-effect transistors at a good yield. Also, it was not possible to acquire superior transistor characteristics from the devices for which it was possible to acquire the transistor characteristics. This may be because, due to the source electrodes, the drain electrodes, and the interconnection members being not stabilized as films, the functions as the electrodes were not sufficient.

According to the disclosed technology, it is possible to provide a semiconductor device that can be easily manufactured and has superior adhesiveness of the source electrode and the drain electrode to the lower layer.

<Second Embodiment>

A second embodiment includes examples of a display device, an image display apparatus, and a system each using field-effect transistors according to the first embodiment. Note that, in the description of the second embodiment, description of the same parts as the already described parts may be omitted.

(Display Device)

A display device according to the second embodiment at least includes a light control device and a drive circuit driving the light control device, and also, other parts as appropriate. The light control device is not specially limited, and any device can be appropriately selected depending on the purpose, as long as the device controls light output according to a drive signal. For example, an electroluminescence (EL) device, an electrochromic (EC) device, a LCD, an electrophoretic device, an electrowetting device, and so forth, can be used.

The drive circuit is not specially limited, and any circuit can be appropriately selected depending on the purpose as long as the device has field-effect transistors according to the first embodiment. Other parts are not specially limited, and any parts can be appropriately selected depending on the purpose.

The display device according to the second embodiment includes the field-effect transistors according to the first embodiment. Therefore, the adhesiveness of the electrodes and the interconnection members to the lower layer is superior, and also, superior field-effect mobility and On/Off ratio can be acquired. As a result, the display device can carry out high-quality display.

(Image Display Apparatus)

An image display apparatus according to the second embodiment includes a plurality of the display devices according to the second embodiment, a plurality of interconnection members, and a display control device, and also, other parts as appropriate. The display devices are not specially limited and can be appropriately selected depending on the purpose as long as the display devices are arranged as a matrix.

The interconnection members are not specially limited and can be appropriately selected depending on the purpose as long as the interconnection members can apply gate voltages and image data signals to the respective field-effect transistors included in the display devices, individually.

The display control device is not specially limited, and can be appropriately selected depending on the purpose as long as the display control device can control the gate voltages and the signal voltages of the respective field-effect transistors via the interconnection members, individually, according to given image data. The other members are not specially limited, and can be appropriately selected depending on the purpose.

Because the image display apparatus according to the second embodiment has the display devices including the field-effect transistors according to the first embodiment, the image display apparatus can display images with high quality.

(System)

The system according to the second embodiment includes the image display apparatus according to the second embodiment, and an image data generation apparatus. The image data generation apparatus generates image data according to image information to be displayed, and outputs the image data to the image display apparatus.

Because the system includes the image display apparatus according to the second embodiment, the system can display image information with high definition.

Below, the display device, the image display apparatus, and the system according to the second embodiment will be described in detail.

Figure 5:
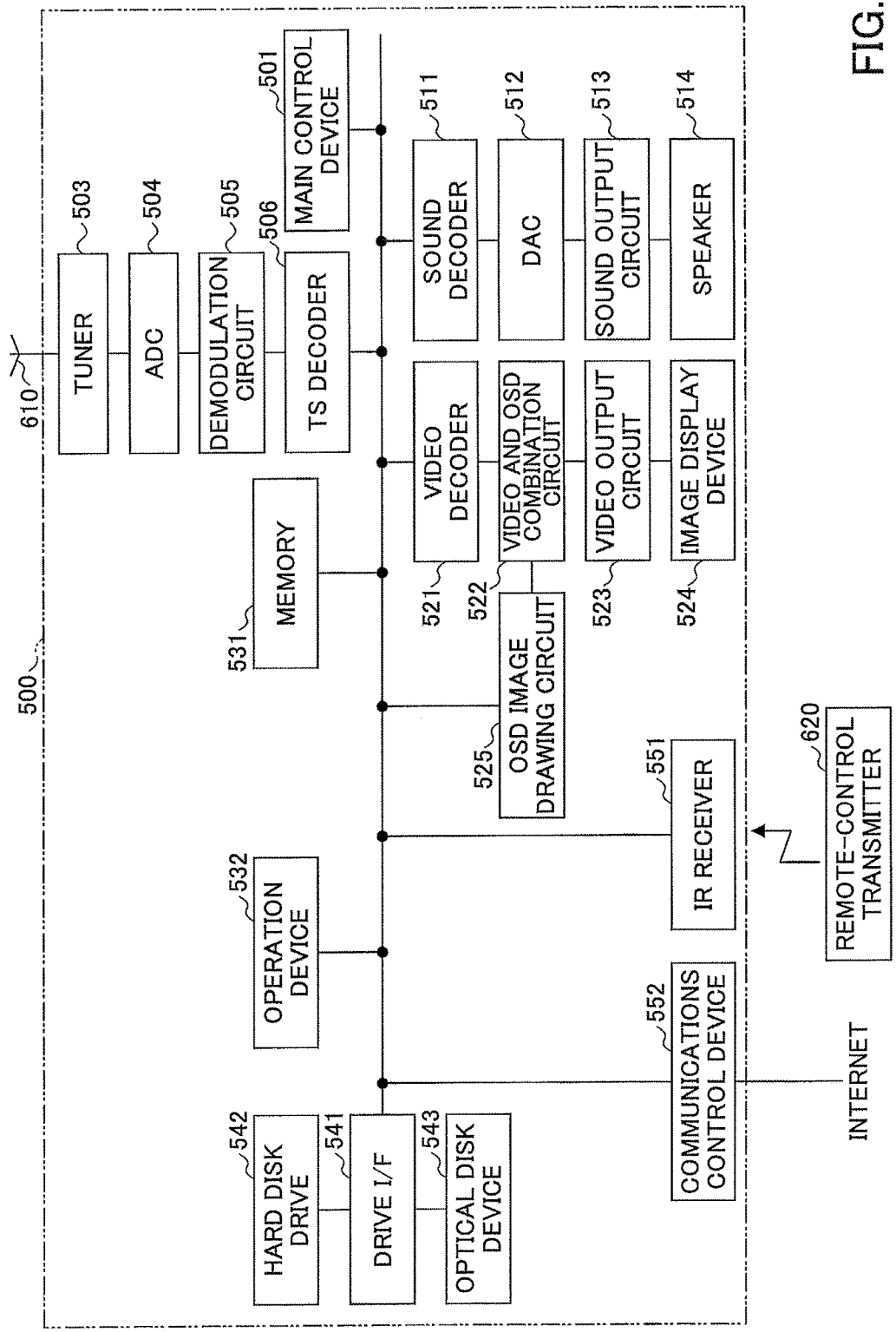
FIG. 5 is a block diagram illustrating a configuration of a television apparatus according to a second embodiment.

FIG. 5 illustrates a general configuration of a television apparatus 500 as a system according to the second embodiment. Note that, connection lines in FIG. 5 indicate flows of signals and information, and do not indicate all of the connection relations among the respective blocks.

The television apparatus 500 according to the second embodiment includes a main control device 501, a tuner 503, an AD converter (ADC) 504, a demodulation circuit 505, a TS (Transport Stream) decoder 506, a sound decoder 511, a DA converter (DAC) 512, a sound output circuit 513, a speaker 514, a video decoder 521, a video and OSD combination circuit 522, a video output signal 523, an image display apparatus 524, an OSD image drawing circuit 525, a memory 531, an operation device 532, a drive interface (drive IF) 541, a hard disk drive 542, an optical disk device 543, an IR receiver 551, and a communications control device 552.

The main control device 501 controls the entirety of the television apparatus 500, and includes a CPU (Central Processing Unit), a flash ROM (Read-Only Memory), and a RAM (Random Access Memory). The flash ROM stores programs described by codes interpretable by the CPU, and various data to be processed by the CPU. The RAM is a work memory.

The tuner 503 selects a broadcast of a previously set channel from among broadcast waves received via an antenna 610. The ADC 504 converts the output signal (analog information) of the tuner 503 to digital information. The demodulation circuit 505 demodulates the digital information from the ADC 504.

The TS decoder 506 carries out TS decoding on the output signal of the demodulation circuit 505 to separate the signal into sound information and video information. The sound decoder 511 decodes the sound information from the TS decoder 506. The DA converter (DAC) 512 converts the output signal of the sound decoder 511 into an analog signal.

The sound output circuit 513 outputs the output signal of the DA converter (DAC) 512 to the speaker 514. The video decoder 521 decodes the video information from the TS decoder 506. The video and OSD combination circuit 522 combines the output signal from the video decoder 521 and the output signal of the OSD image drawing circuit 525.

The video output circuit 523 outputs the output signal of the video and OSD combination circuit 522 to the image display apparatus 524. The OSD image drawing circuit 525 includes a character generator to display characters/letters and drawings/figures on the screen of the image display apparatus 524, and generates a signal that includes display information according to instructions from the operation device 532 and the IR receiver 551.

The memory 531 temporarily stores AV (Audio-Visual) data and so forth. The operation device 532 includes an input medium such as, for example, a control panel (not illustrated in the drawings), and sends various sorts of information that is input by a user to the main control device 501. The drive IF 541 is a bidirectional communications interface, and conforms to, for example, ATAPI (AT Attachment Packet Interface).

The hard disk drive 542 includes a hard disk and a drive device to drive the hard disk. The drive device records data in the hard disk and reproduces data from the hard disk. The optical disk device 543 records data in an optical disk (for example, a DVD), and reproduces data from the optical disk.

The IR receiver 551 receives an optical signal from a remote-control transmitter 620, and sends the received signal to the main control device 501. The communications control device 552 controls communications carried out with the Internet. Thus, it is possible to acquire various sorts of information via the Internet.

Figure 6:
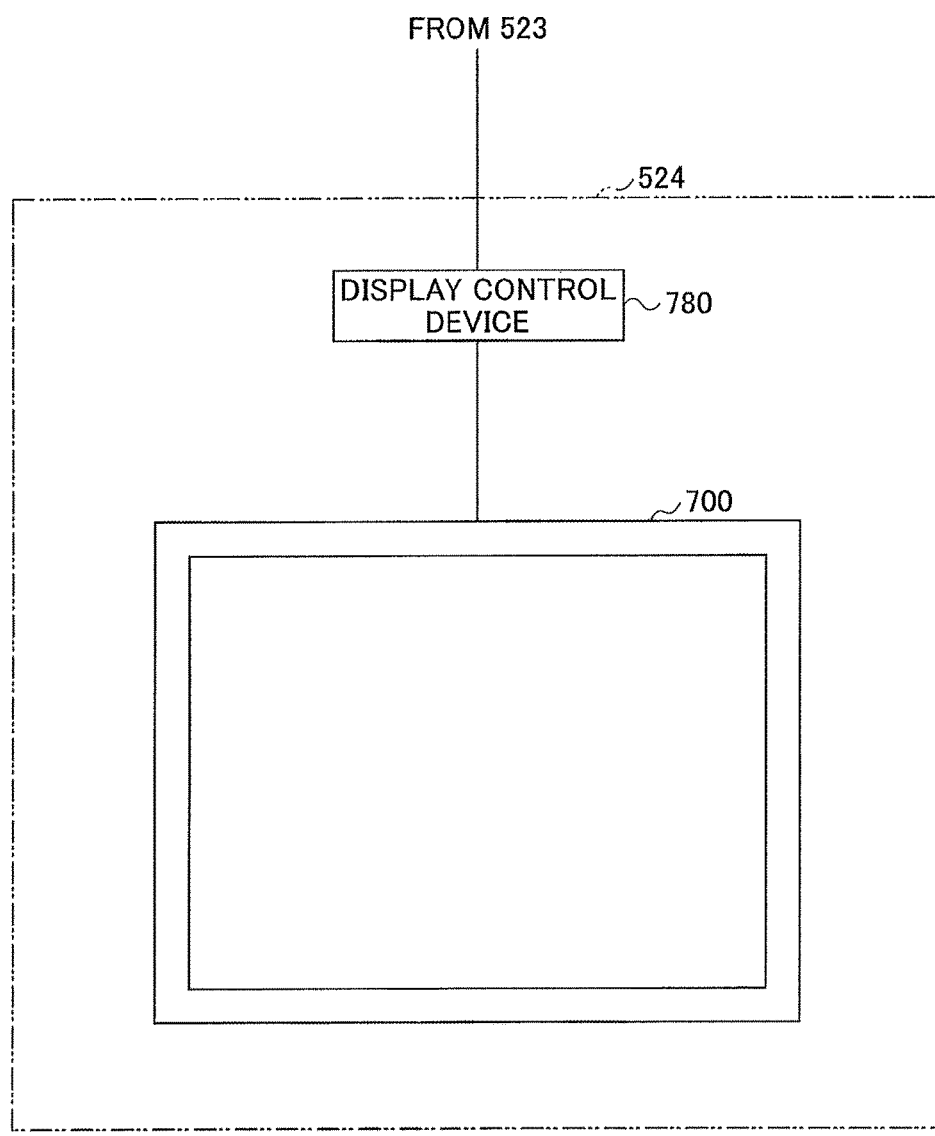
Figure 7:
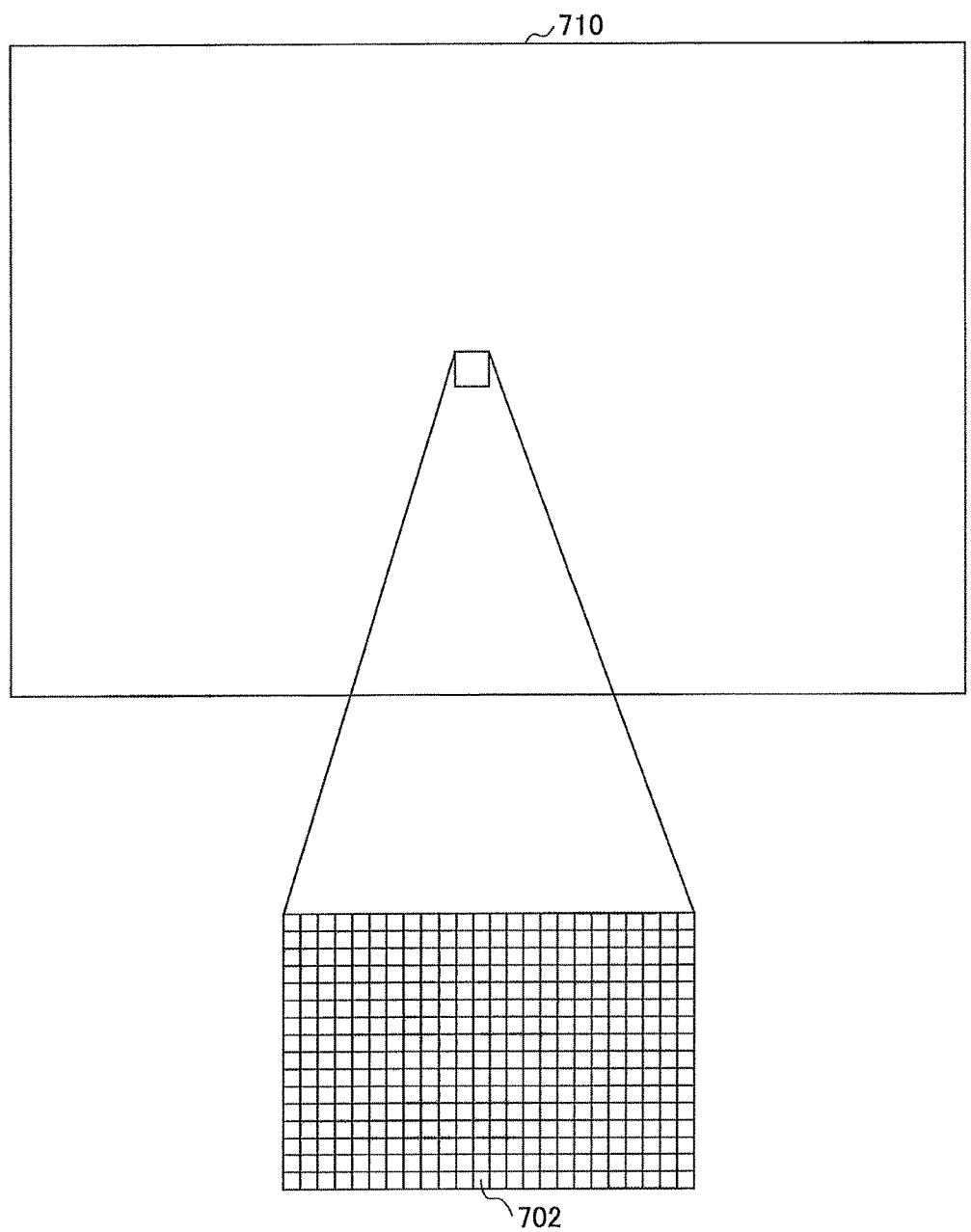

The image display apparatus 524 includes, for example, as illustrated in FIG. 6, a display unit 700 and a display control device 780. The display unit 700 includes a display 710 where, for example, a plurality of display devices 702 (here, n by m) are arranged as a matrix, as illustrated in FIG. 7.

Also, the display 710 includes, for example, as illustrated in FIG. 8, n scan lines (X0, X1, X2, X3, . . . , Xn-2, and Xn-1) arranged at equal intervals along an x-axis, m data lines (Y0, Y1, Y2, Y3, . . . , Ym-1) arranged at equal intervals along an y-axis, and m current supply lines (Y0$i$, Y1$i$, Y2$i$, Y3$i$, . . . , Ym-1$i$) arranged at equal intervals along the y-axis. Then, through the scan lines and the data lines, it is possible to determine the display devices 702, respectively.

Figure 9:
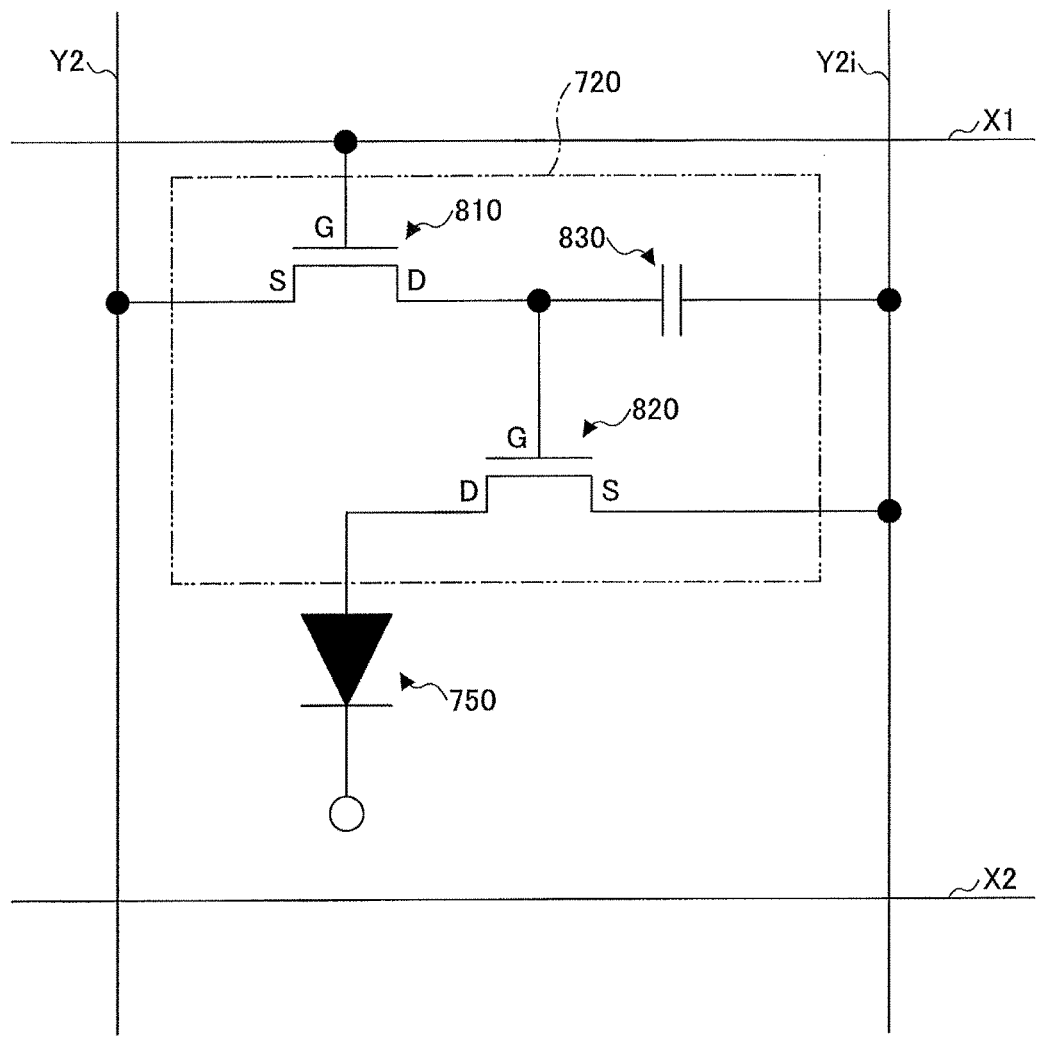
FIG. 9 illustrates a display device according to the second embodiment.

Each display device 702 includes, for example, as illustrated in FIG. 9, an organic EL (electroluminescence) device 750 and a drive circuit 720 causing the organic EL device 750 to emit light. That is, the display 710 is a so-called organic EL display of an active matrix type. Also, the display 710 is a color display of 32 inches. Note that, the size is not limited to this size.

Figure 10:
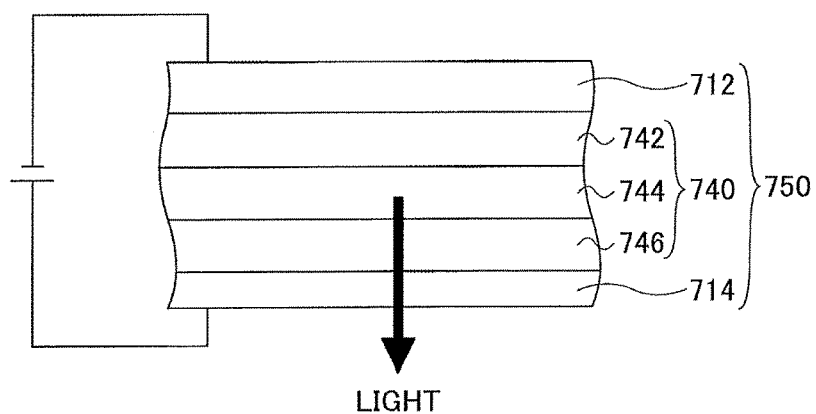
FIG. 10 illustrates an organic EL according to the second embodiment.

The organic EL device 750 includes, for example, as illustrated in FIG. 10, an organic EL thin film layer 740, a cathode 712, and an anode 714.

The organic EL device 750 can be placed, for example, on a lateral side of the field-effect transistor. In this case, the organic EL device 750 and the field-effect transistor can be formed on the same base. However, the arrangement is not limited to this arrangement. For example, the organic EL device 750 can be placed above the field-effect transistor. In this case, the gate electrode is transparent, and, for this purpose, as the gate electrode, a transparent oxide having electrical conductivity such as ITO, $In_2O_3$, $SnO_2$, ZnO, ZnO to which Ga is added, ZnO to which Al is added, $SnO_2$ to which SB is added, or the like, is used.

In the organic EL device 750, aluminum (Al) is used as the cathode 712. Note that, it is also possible to use a magnesium (Mg)-silver (Ag) alloy, an aluminum (Al)-lithium (Li) alloy, an ITO (Indium Tin Oxide), or the like. As the anode 714, ITO is used. Note that, it is also possible to use an oxide having electrical conductivity such as $In_2O_3$, $SnO_2$, ZnO, or the like, a silver (Ag)-neodymium (Nd) alloy, or the like.

The organic EL thin film layer 740 includes an electron transport layer 742, a light emittance layer 744, and a positive hole transport layer 746. The cathode 712 is connected to the electron transport layer 742, and the anode 714 is connected to the positive hole transport layer 746. When a certain voltage is applied between the anode 714 and the cathode 712, the light emittance layer 744 emits light.

Also, as illustrated in FIG. 9, the drive circuit 720 has two field-effect transistors 810 and 820, and a capacitor 830. The field-effect transistor 810 acts as a switching device. The gate electrode G is connected to a corresponding one of the scan lines, and the source electrode S is connected to a corresponding one of the data lines. The drain electrode D is connected to one terminal of the capacitor 830.

The capacitor 830 stores the state of the field-effect transistor 810, i.e., data. The other terminal of the capacitor 830 is connected to the corresponding one of the current supply lines.

The field-effect transistor 820 supplies a large current to the organic EL device 750. The gate electrode G is connected to the drain electrode D of the field-effect transistor 810. The drain electrode D is connected to the anode 714 of the organic EL device 750, and the source electrode S is connected to the corresponding one of the current supply lines.

Therefore, when the field-effect transistor 810 has been turned on, the field-effect transistor 820 drives the organic EL device 750.

Figure 11:
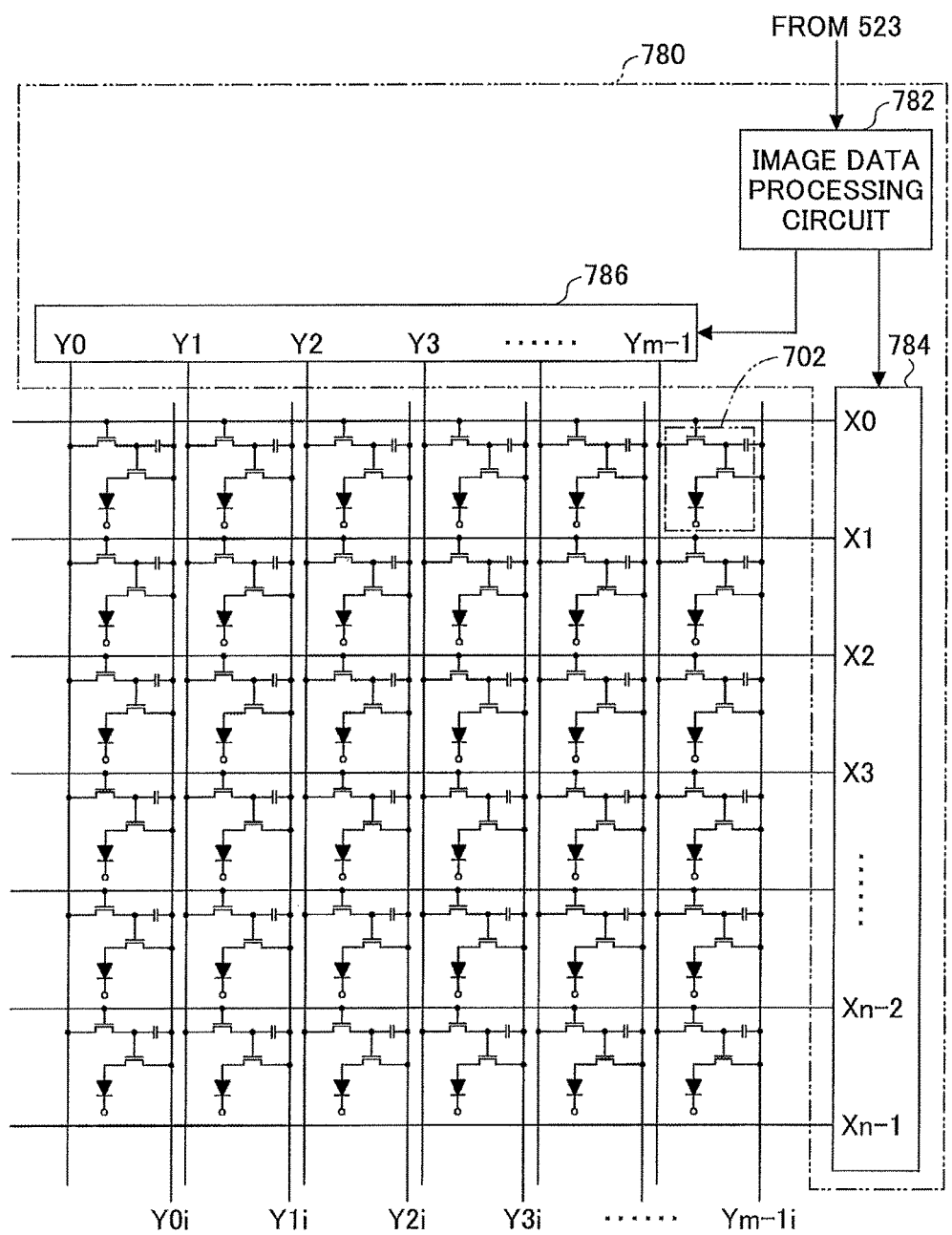
FIG. 11 illustrates the television apparatus according to the second embodiment.

The display control device 780 has, for example, as illustrated in FIG. 11, an image data processing circuit 782, a scan line drive circuit 784, and a data line drive circuit 786.

The image data processing circuit 782 determines the brightness of each of the plurality of display devices 702 in the display 710 based on the output signal of the video output circuit 523. The scan line drive circuit 784 applies voltages to the n scan lines, individually, according to the instructions of the image data processing circuit 782. The data line drive circuit 786 applies voltages to the m data lines, individually, according to the instructions of the image data processing circuit 782.

As can be seen from the above description, in the television apparatus 500 according to the second embodiment, the image data generation apparatus is configured with the video decoder 521, the video and OSD combination circuit 522, the video output circuit 523, and the OSD image drawing circuit 525.

Also, in the above description, the case where the light control device is an organic EL device has been described. However, the light control device is not limited to an organic EL device. It is also possible to use a liquid crystal device, an electrochromic device, an electrophoretic device, or an electrowetting device.

Figure 12:
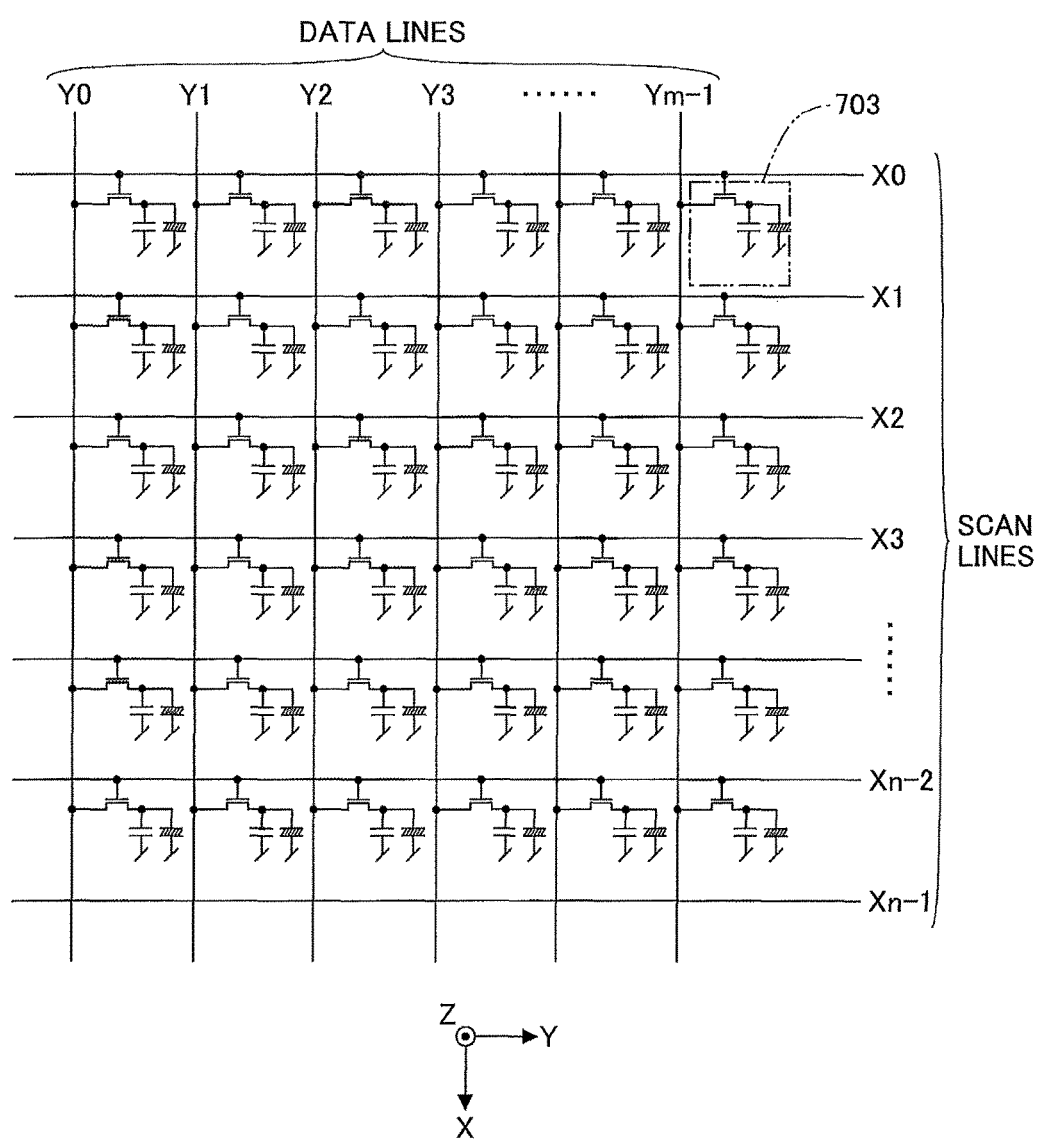
FIGS. 12 and 13 illustrate another display device according to the second embodiment.

For example, if the light control device is a liquid crystal device, a liquid crystal display is used as the display 710. In this case, as illustrated in FIG. 12, no current supply lines are used for the display devices 703.

Figure 13:
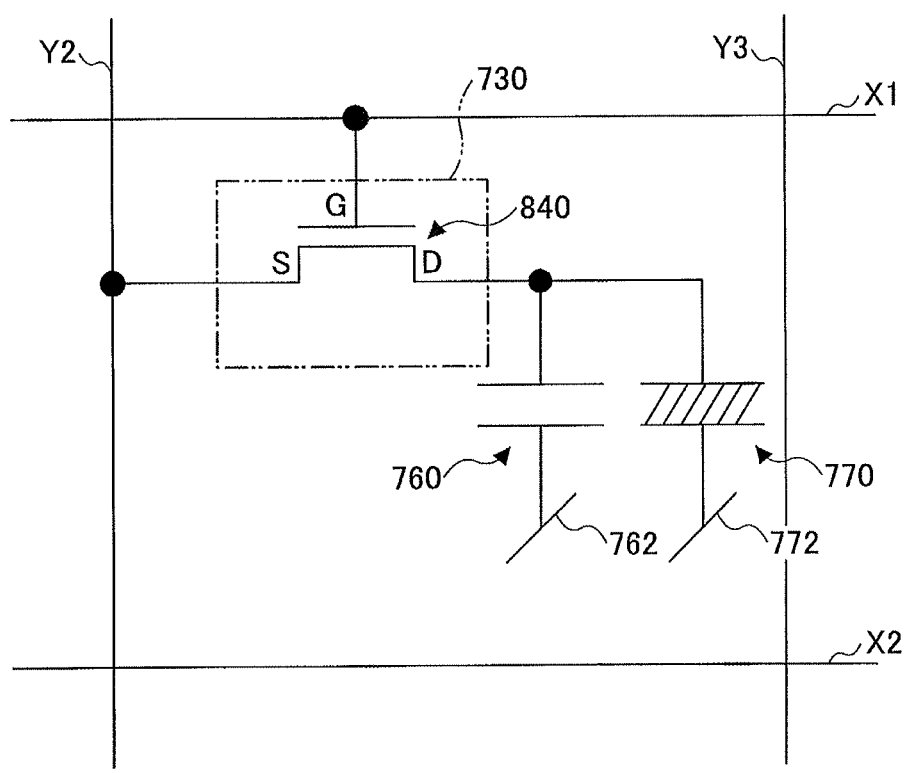

Also, in this case, for example, as illustrated in FIG. 13, the drive circuit 730 can be configured with a single field-effect transistor 840, similar to the field-effect transistor (810 or 820) illustrated in FIG. 9. Concerning the field-effect transistor 840, the gate electrode G is connected to a corresponding one of the scan lines, and the source electrode S is connected to a corresponding one of the data lines. Also, the drain electrode D is connected to a pixel electrode of the liquid crystal device 770, and a capacitor 760. Note that, in FIG. 13, electrodes 762 and 772 are opposite electrodes (common electrode) of the capacitor 760 and the liquid crystal device 770, respectively.

Thus, the semiconductor devices, the display devices, the display apparatuses, and the systems have been described in the embodiments. However, embodiments are not limited to the above-described embodiments, and various modifications and replacements may be made.

For example, concerning the above-mentioned embodiments, the description has been made assuming the case where the system is a television apparatus. However, the system is not limited to a television apparatus. An embodiment of the present invention can be any system where as an apparatus to display images and information, the image display apparatus 524 is included. For example, an embodiment of the present invention can be a computer system where a computer (for example, a personal computer) and the image display apparatus 524 are connected together.

It is also possible to use the image display apparatus 524 as a display device in a portable information apparatus such as a cellular phone, a portable music reproduction apparatus, a portable moving picture reproduction apparatus, an electronic book, a PDA (Personal Digital Assistant), or the like, an imaging apparatus such as a still camera, a video camera, or the like. It is also possible to use the image display apparatus 524 as a display device to display various sorts of information in a mobile system such as an automobile, an airplane, an electric train, a ship, or the like. Further, it is also possible to use the image display apparatus 524 as a display device to display various sorts of information in a measurement apparatus, an analysis apparatus, a medical apparatus, or an advertising medium.

<Third Embodiment>

A third embodiment is one example of a display device array using field-effect transistors according to the variant of the first embodiment. Note that, in the description of the third embodiment, description of the same parts as the already described parts may be omitted.

Figure 14:
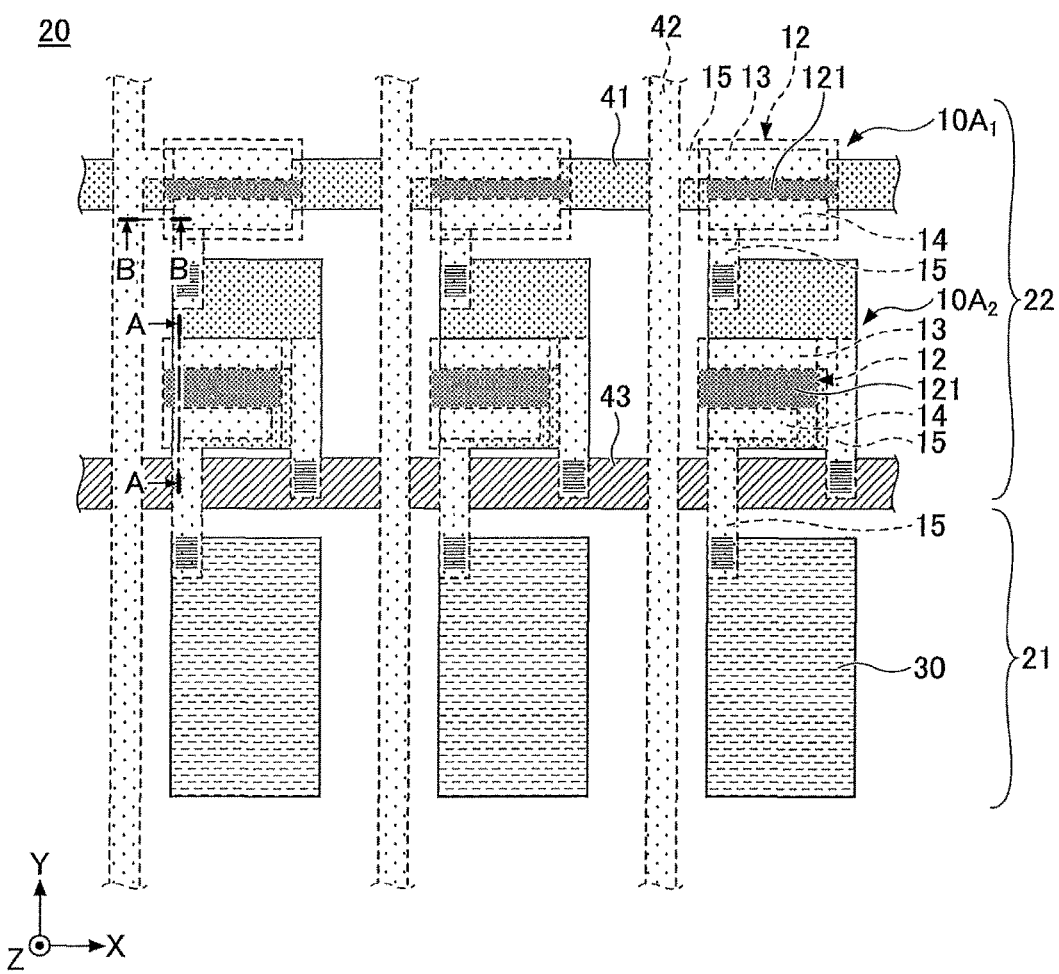
FIG. 14 is a plan view illustrating a display device array according to a third embodiment.
Figure 15:
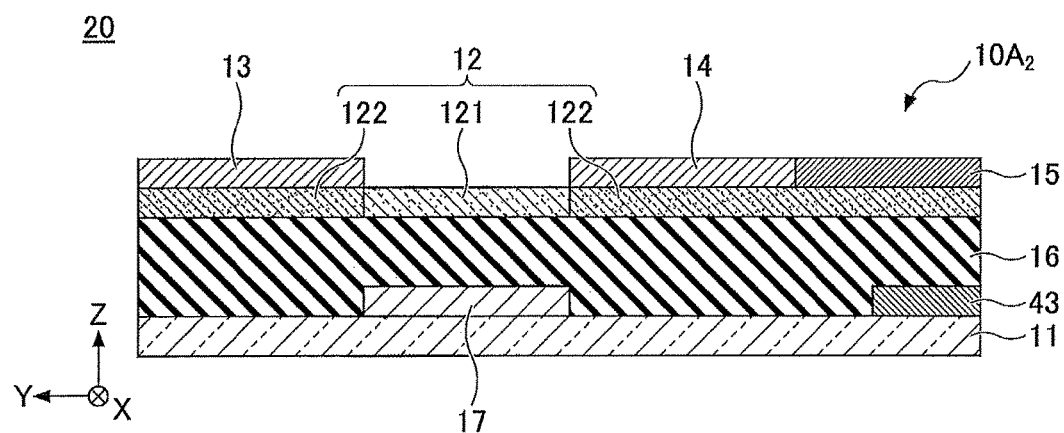
FIG. 15 is a sectional view of the display device array taken along an A-A line of FIG. 14.
Figure 16:
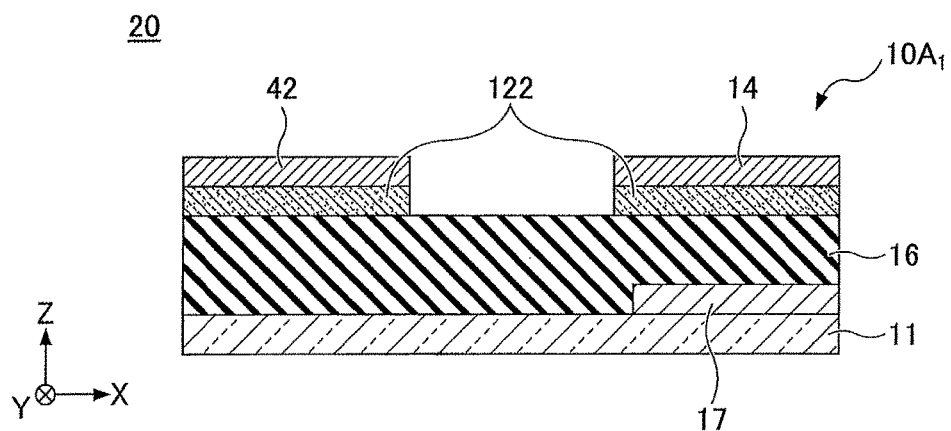
FIG. 16 is a sectional view of the display device array taken along a B-B line of FIG. 14.

FIG. 14 is a plan view illustrating the display device array according to the third embodiment. FIG. 15 is a sectional view of the display device array taken along an A-A line of FIG. 14. FIG. 16 is a sectional view of the display device array taken along a B-B line of FIG. 14.

As illustrated in FIGS. 14-16, the display device array 20 according to the third embodiment includes a plurality of light control devices 21, and a plurality of drive circuits 22 that drive the light control devices 21. The display device array 20 can further include other members as appropriate.

Each light control device 21 is not specially limited, and any device can be appropriately selected depending on the purpose, as long as the device controls light output according to a drive signal. For example, an EL device, an EC device, a LCD, an electrophoretic device, an electrowetting device, and so forth, can be used.

Each drive circuit 22 includes, for example, two field-effect transistors 10A according to the variant of the first embodiment described above (for the sake of convenience, the two field-effect transistors 10A will be referred to as a field-effect transistor 10A$_1$ and a field-effect transistor 10A$_2$). Note that it is also possible to use field-effect transistors 10 according to the first embodiment as the drive circuit 22.

The field-effect transistors 10A$_1$ and 10A$_2$ are formed on the same base 11 to be adjacent to each other in a Y-direction. The corresponding light control device 21 is formed on the same base 11 to be adjacent to the field-effect transistor 10A$_2$ in the Y-direction. However, the arrangement is not limited to the above-mentioned arrangement, and, for example, the light control device 21 can be placed above the field-effect transistor 10A$_2$. The light control device 21 includes a pixel electrode 30.

The display device array 20 includes scan lines 41 formed along an x-axis at equal intervals, data lines 42 formed along a y-axis at equal intervals, and current supply lines 43 formed along the x-axis at equal intervals. Through the scan lines 41 and the data lines 42, it is possible to determine display devices each of which includes the light control device 21 and the drive circuit 22, respectively. The respective display devices are arranged as a matrix in the display device array 20. Note that the number of the scan lines 41, the number of the data lines 42, and the number of the current supply lines 43 can be appropriately determined.

In the drive circuit 22, the field-effect transistors $10A_1$ operate as switching devices. In each field-effect transistor $10A_1$, the gate electrode 17 is connected to the corresponding scan line 41 via the interconnection member 15, the source electrode 13 is connected to the corresponding data line 42 via the interconnection member 15, and the drain electrode 14 is connected to the gate electrode 17 of the corresponding field-effect transistor $10A_2$ via the interconnection member 15.

The field-effect transistors $10A_2$ supply large currents to the light control devices 21. In each field-effect transistor $10A_2$, the source electrode 13 is connected to the corresponding current supply line 43 via the interconnection members 15 and the drain electrode 14 is connected to the pixel electrode 30 of the corresponding light control device 21 via the interconnection member 15.

When the field-effect transistor $10A_1$ has entered a "turned on" state, the corresponding field-effect transistor $10A_2$ drives the corresponding light control device 21.

Figure 17:
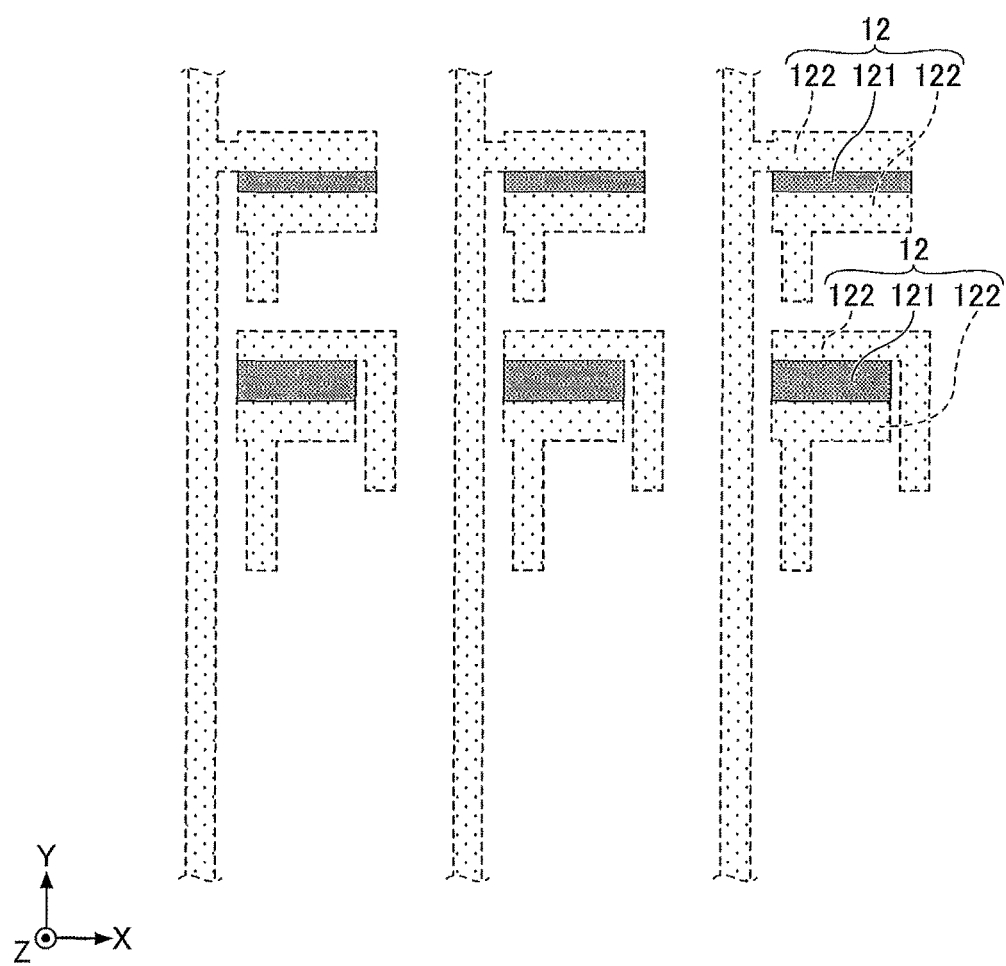
FIG. 17 is a plan view illustrating regions where semiconductor layers are formed in the display device array according to the third embodiment.

FIG. 17 is a plan view illustrating regions where semiconductor layers are formed in the display device array according to the third embodiment. As described above, the semiconductor layer 12 of each of the field-effect transistors $10A_1$ and $10A_2$ includes the channel-forming region 121 and the non-channel-forming regions 122.

As can be seen from a comparison between FIGS. 17 and 14, in the display device array 20, parts of the non-channel-forming regions 122 are formed at areas where the parts of the non-channel-forming regions 122 overlap with none of the source electrode 13, the drain electrode 14, and the gate electrode 17.

Parts of the non-channel-forming regions 122 can be formed at areas where the parts of the non-channel-forming regions 122 overlap with, for example, the interconnection member 15 that connects the source electrode 13 of field-effect transistor $10A_2$ and the current supply line 43, the interconnection member 15 that connects the drain electrode 14 of the field-effect transistor $10A_2$ and the pixel electrode 30, the interconnection member 15 that connects the field-effect transistor $10A_1$ and the field-effect transistor $10A_2$, and the data line 42.

Thus, parts of the non-channel-forming regions 122 can be formed at areas that overlap with none of the source electrode 13, the drain electrode 14, and the gate electrode 17, as appropriate.

Figure 18:
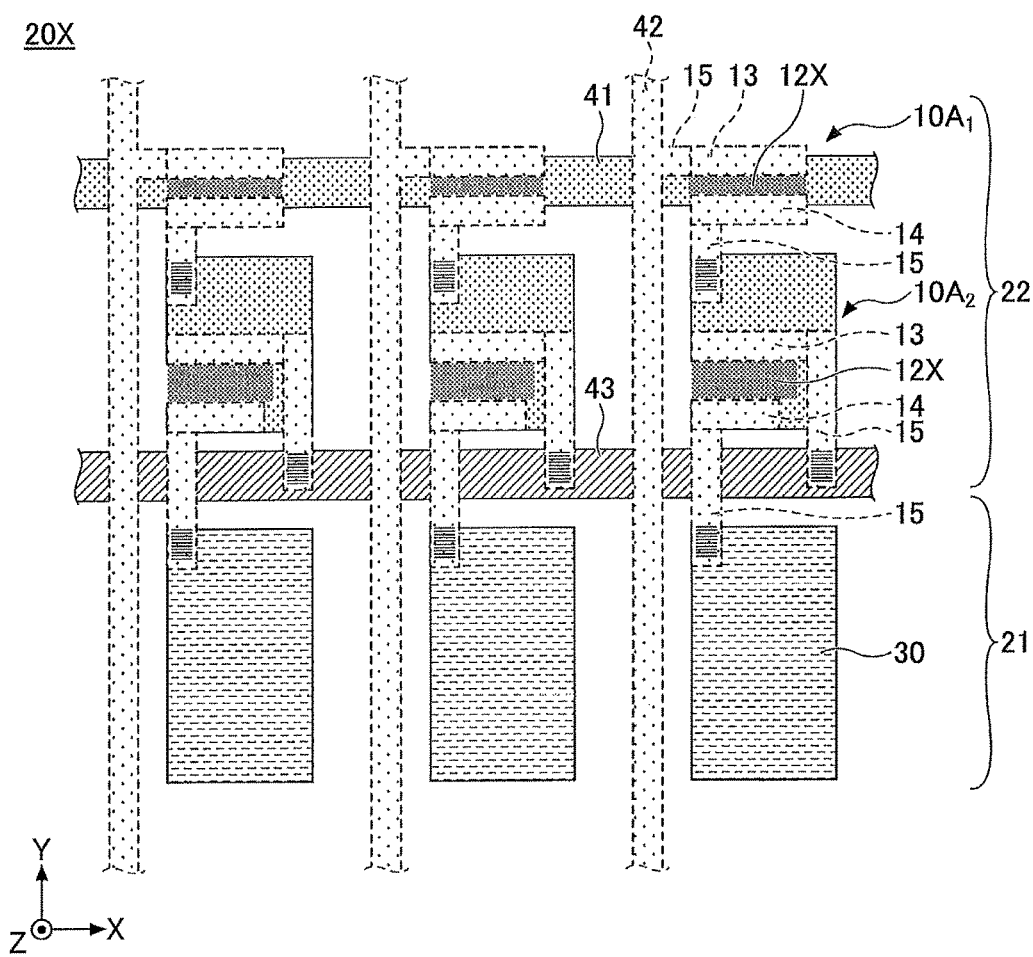
FIG. 18 is a plan view illustrating a display device array according to a comparison example.

FIG. 18 is a plan view illustrating a display device array according to a comparison example. In the display device array 20X illustrated in FIG. 18, a semiconductor layer 12X is formed near an area sandwiched between a source electrode 13 and a drain electrode 14 in a plan view. That is, the semiconductor layer 12X is formed at an area corresponding to the channel-forming regions 121 of the semiconductor layers 12 in the display device array 20 illustrated in FIG. 14, and is not formed at the areas corresponding to the non-channel-forming regions 122.

In the display device array 20, different from the display device array 20X according to the comparison example, the non-channel-forming regions 122 that are parts of the semiconductor layers 12 are formed not only in the layers under the source electrodes 13 and the drain electrodes 14 but also in the layers under the interconnection members 15 and the data lines 42, to function as adhesive layers. Thereby, the adhesiveness of the respective metal films used as the source electrodes 13 and so forth to the lower layers is improved whereby the superior film stability (i.e., the robustness against manufacturing processes) can be acquired.

What is claimed is:

1. A semiconductor device comprising:
   a base;
   a gate electrode to which a gate voltage is applied;
   a source electrode and a drain electrode through which an electric current is generated according to the gate voltage being applied to the gate electrode;
   a semiconductor layer made of an oxide semiconductor;
   a gate insulating layer inserted between the gate electrode and the semiconductor layer, wherein
   the semiconductor layer includes a channel-forming region and a non-channel-forming region, each having an insulating-layer-facing face facing the gate insulating layer, and
   a base-facing face facing the base layer and opposite to the insulating-layer-facing face,
   the channel-forming region is in contact with the source electrode and the drain electrode, and
   the non-channel-forming region is in contact with the source electrode and the drain electrode.

2. The semiconductor device according to claim 1, further comprising:
   an interconnection member in contact with the source electrode or the drain electrode, the interconnection member having an insulating-layer-facing face and a base-facing face, wherein
   the insulating-layer-facing face of the non-channel-forming region is in contact with the base-facing face of the interconnection member connected with the source electrode or the drain electrode.

3. A display device comprising:
   a light control device configured to emit light; and
   a drive circuit configured to control light output of the light control device, wherein
   the drive circuit includes the semiconductor device of claim 2, the semiconductor device driving the light control device.

4. The display device according to claim 3, wherein the light control device includes any one of an electroluminescence device, an electrochromic device, a liquid crystal device, an electrophoretic device, and an electrowetting device.

5. A display apparatus comprising:
   a display unit that includes a matrix of a plurality of the display devices of claim 3; and
   a display control device configured to control the display devices, individually.

6. A system comprising:
   the display apparatus of claim 5; and
   an image data generation apparatus configured to supply image data to the display apparatus.

7. The semiconductor device according to claim 1, wherein the semiconductor device is a top-contact type.

8. The semiconductor device according to claim 2, wherein the semiconductor device is a top-contact type.

9. A display device comprising:
   a light control device configured to emit light; and
   a drive circuit configured to control light output of the light control device, wherein the drive circuit includes the semiconductor device of claim 8, the semiconductor device driving the light control device.

10. The display device according to claim 9, wherein the light control device includes any one of an electroluminescence device, an electrochromic device, a liquid crystal device, an electrophoretic device, and an electrowetting device.

11. A display apparatus comprising:
a display unit that includes a matrix of a plurality of the display devices of claim 9; and
a display control device configured to control the display devices, individually.

12. A system comprising:
the display apparatus of claim 11; and
an image data generation apparatus configured to supply image data to the display apparatus.

13. A display device comprising:
a light control device configured to emit light; and
a drive circuit configured to control light output of the light control device, wherein
the drive circuit includes the semiconductor device of claim 7, the semiconductor device driving the light control device.

14. The display device according to claim 13, wherein the light control device includes any one of an electroluminescence device, an electrochromic device, a liquid crystal device, an electrophoretic device, and an electrowetting device.

15. A display apparatus comprising:
a display unit that includes a matrix of a plurality of the display devices of claim 13; and
a display control device configured to control the display devices, individually.

16. A system comprising:
the display apparatus of claim 15; and
an image data generation apparatus configured to supply image data to the display apparatus.

17. A display device comprising:
a light control device configured to emit light; and
a drive circuit configured to control light output of the light control device, wherein
the drive circuit includes the semiconductor device of claim 1, the semiconductor device driving the light control device.

18. The display device according to claim 17, wherein the light control device includes any one of an electroluminescence device, an electrochromic device, a liquid crystal device, an electrophoretic device, and an electrowetting device.

19. A display apparatus comprising:
a display unit that includes a matrix of a plurality of the display devices of claim 17; and
a display control device configured to control the display devices, individually.

20. A system comprising:
the display apparatus of claim 19; and
an image data generation apparatus configured to supply image data to the display apparatus.

* * * * *